United States Patent [19]
Adachi et al.

[11] Patent Number: 6,088,819
[45] Date of Patent: Jul. 11, 2000

[54] DYNAMIC SEMICONDUCTOR MEMORY DEVICE AND METHOD OF TESTING THE SAME

[75] Inventors: Yukinobu Adachi; Hiromi Okimoto; Masanori Hayashikoshi, all of Hyogo, Japan

[73] Assignee: Mitsubishi Denki Kabushiki Kaisha, Tokyo, Japan

[21] Appl. No.: 08/910,221

[22] Filed: Aug. 13, 1997

[30] Foreign Application Priority Data

Jan. 9, 1997 [JP] Japan .................................. 9-002261

[51] Int. Cl.[7] .............................. G11C 29/00; G11C 7/00
[52] U.S. Cl. ...................... 714/718; 365/189.01; 365/201
[58] Field of Search .................... 371/21.1, 21.2, 371/10.2, 10.3, 24, 25.1, 67.1, 71; 395/183.18, 185.07; 364/265.3, 959.4, 970, 970.1; 711/105, 111; 365/200, 201, 189.01, 189.07, 191; 714/718, 719, 735, 736, 819, 824, 710, 711, 20, 54

[56] References Cited

U.S. PATENT DOCUMENTS

| 4,502,140 | 2/1985 | Proebsting ................................ 371/28 |
|---|---|---|
| 4,680,762 | 7/1987 | Hardee et al. .......................... 371/21.1 |
| 4,692,901 | 9/1987 | Kumanoya et al. ............... 365/189.04 |
| 4,956,816 | 9/1990 | Atsumi et al. ...................... 365/185.22 |
| 5,034,923 | 7/1991 | Kuo et al. ........................... 365/189.01 |
| 5,140,553 | 8/1992 | Choi et al. ............................... 365/201 |
| 5,337,272 | 8/1994 | Suwa et al. ............................. 365/201 |

FOREIGN PATENT DOCUMENTS

| 62-229599 | 10/1987 | Japan . |
| 3-160699 | 7/1991 | Japan . |
| 7-57472 | 3/1995 | Japan . |

*Primary Examiner*—Trinh L. Tu
*Attorney, Agent, or Firm*—McDermott, Will & Emery

[57] ABSTRACT

In a DRAM, a boosted voltage Vpp is applied to a selected word line WL1 in a normal mode. In a test mode, a power supply voltage Vcc at a level lower than Vpp level is applied onto selected word line WL1. High data written into memory cell in the test mode of the DRAM is at the level lower than that of the high data written into memory cell in the normal mode. Therefore, a time before an H→L error occurs can be reduced, and a test time can be reduced.

8 Claims, 19 Drawing Sheets

DYNAMIC SEMICONDUCTOR MEMORY DEVICE AND METHOD OF TESTING THE SAME

BACKGROUND OF THE INVENTION

1. Field of the Invention

The present invention relates to a dynamic semiconductor memory device and a method of testing the same, and in particular to a dynamic semiconductor memory device allowing efficient detection of a failure that high data written into a memory cell erroneously changes into low data as well as a test method for the same.

2. Description of the Background Art

FIG. 22 is a circuit diagram specifically showing a memory cell of a dynamic semiconductor memory device in the prior art, and particularly a memory cell of a dynamic random access memory which will be referred to merely as a "DRAM" hereinafter. Referring to FIG. 22, a memory cell 25 is formed of a memory cell transistor 27 and a memory cell capacitor 29.

An operation of writing high data ("1" data) into memory cell 25 will be described below. In the following description, it is assumed that a power supply voltage is Vcc, and ground voltage is GND. Bit lines BL and /BL have been precharged to (½)Vcc level by an equalize/precharge circuit (not shown). A voltage higher than (Vcc+Vth) level is applied onto a word line WL, so that memory cell transistor 27 is turned on. Vth is a threshold voltage of memory cell transistor 27. After deactivation of the precharge/equalize circuit, a voltage at Vcc level is applied from an I/O line IO onto bit line BL. Meanwhile, a voltage at GND level is applied onto a bit line /BL from an I/O line /IO. Thereby, a storage node SN is set to a potential at Vcc level. Thus, high data is written into memory cell 25.

A failure which may occur in a DRAM will be described below. A manufacturing method and a structure of memory cells have been complicated to a higher extent in accordance with improvement of a manufacturing process technology of DRAMs. In accordance with this, there has been a growth in failures due to defects in processes and steps. The failures are, for example, a pause refresh failure and a disturb refresh failure. The pause refresh failure will now be described below. Due to N-P junction leak between a storage node SN and a substrate in a memory cell, high data already written in the memory cell erroneously changes into low data in some cases. This failure is the pause refresh failure. The disturb refresh failure is as follows. Due to a subthreshold leak current of memory cell transistor 27, charges accumulated in storage node SN flow out onto bit line BL, so that high data written in memory cell 25 erroneously changes into low data in some cases. This failure is called the disturb refresh failure. The error that the high data written in the memory cell changes into the low data will be referred to as an "HAL error" hereinafter.

Since an N-P junction leak current between storage node SN and the substrate in the memory cell 25 as well as a subthreshold leak current at memory cell transistor 27 are extremely small, it takes a considerably long time before the H→L error occurs after flow of charges from storage node SN set to the potential at Vcc level. In the conventional DRAM, therefore, detection of the H→L error requires a considerably long time, which disadvantageously increases a production cost.

SUMMARY OF THE INVENTION

An object of the invention is to provide a dynamic semiconductor memory device which can reduce a time required for detection of an H→L error as well as a test method for the same.

Another object of the invention is to provide a dynamic semiconductor memory device which allows efficient detection of an H→L error as well as a test method for the same.

A dynamic semiconductor memory device according to the invention includes a plurality of memory cells and a write voltage control circuit. The plurality of memory cells are arranged in a matrix form of rows and columns. Each memory cell holds data at a high or low level. In the operation of writing data at the high level into the memory cell, the write voltage control circuit writes a voltage at a first level in a normal mode, and writes a voltage at a second level lower than the first level in a test mode.

In a method of testing a dynamic semiconductor memory device according to the invention, the test is effected on the dynamic semiconductor memory device having a plurality of memory cells holding data at a high or low level. The method of testing the dynamic semiconductor memory device includes the steps of writing data at the high level into each memory cell, reading data held in each memory cell after writing data at the high level into the memory cell, and determining whether the written data at the high level has changed into the data at the low level based on the read data, or not. In the step of writing the data at the high level, a voltage at a level lower than that for writing the data at the high level in the normal mode is written. According to the invention, writing of data at the high level into the memory cell is performed such that a potential at a first level is written in the normal mode, and a potential at a second level lower than the first level is written in the test mode. Thereby, a time before an H→L error occurs can be reduced, and thus a test time can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
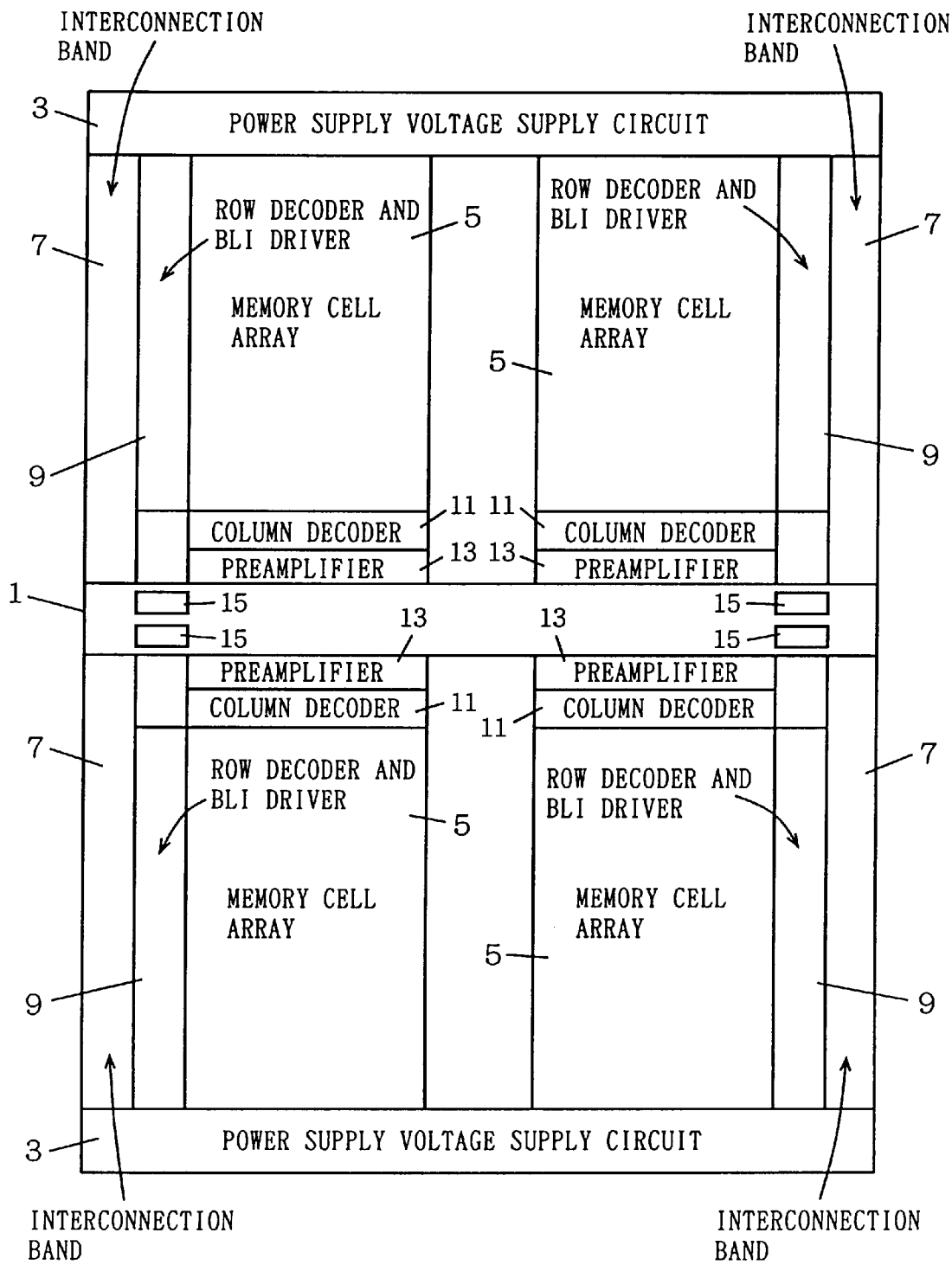
FIG. 1 is a schematic block diagram showing a whole structure of a DRAM according to an embodiment 1 of the invention.

Referring to FIG. 1, a whole structure of a dynamic semiconductor memory device (DRAM) of an embodiment 1 of the invention will be described below. In FIG. 1, a DRAM 1 includes two power supply voltage supply circuits 3 and four memory cell arrays 5. For each memory cell array 5, DRAM 1 includes an interconnection band 7, a row decoder and BLI driver 9, a column decoder 11, a preamplifier 13 and a control circuit 15. Interconnection band 7 is provided with interconnections controlling row decoder and BLI driver 9. Each memory cell array 5 having a capacity of 4 Mbits will be described below.

Figure 2:
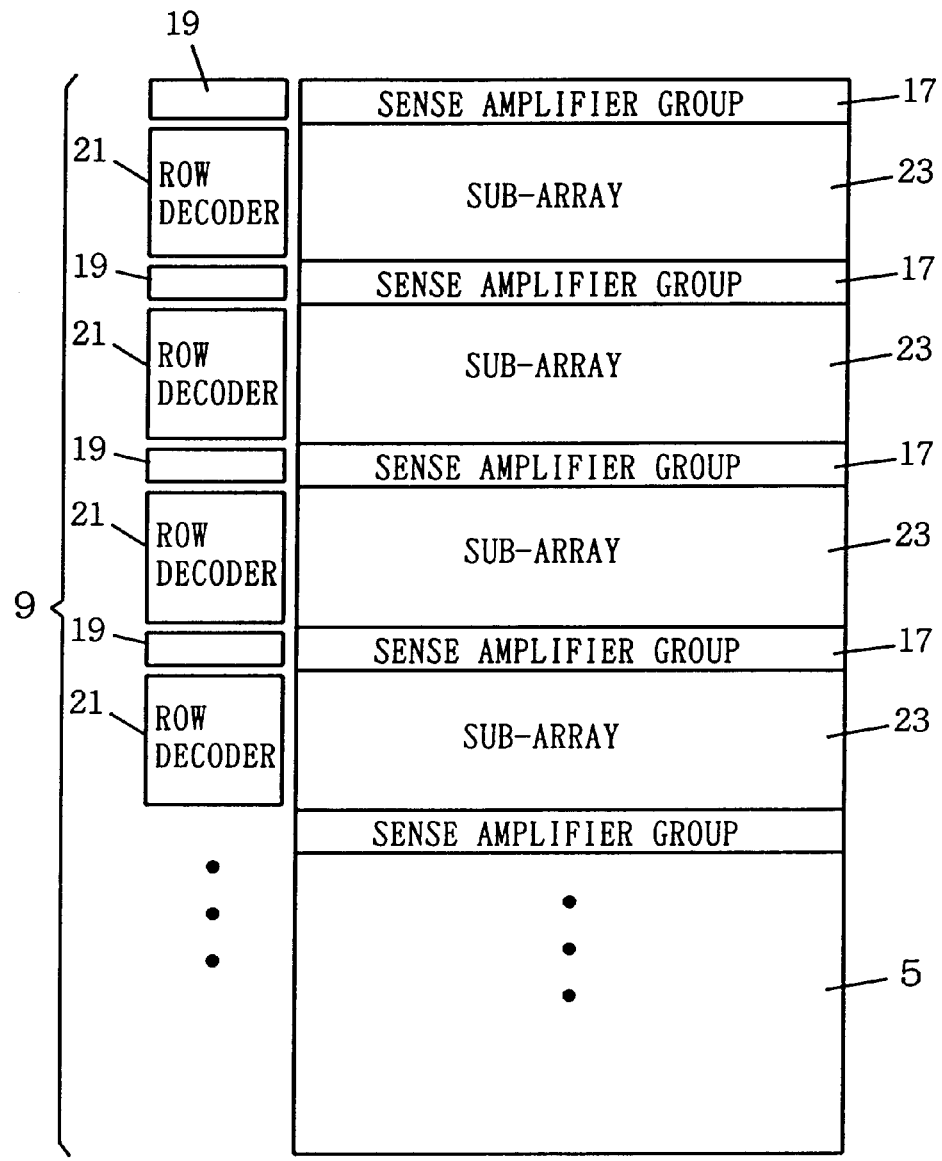
FIG. 2 is a schematic block diagram showing row decoders, BLI drivers and a memory cell array in FIG. 1.

FIG. 2 shows memory cell array 5 as well as row decoder and BLI driver 9 shown in FIG. 1. The same portions as those in FIG. 1 bear the same reference numbers, and will not be described below. In FIG. 2, row decoder and BLI driver 9 includes a plurality of BLI drivers 19 and a plurality of row decoders 21. Memory cell array 5 includes a plurality of sense amplifier groups 17 and a plurality of sub-arrays 23. The plurality of BLI drivers 19 are arranged correspondingly to the plurality of sense amplifier groups 17, respectively. The plurality of row decoders 21 are arranged correspondingly to the plurality of sub-arrays 23, respectively. Sixteen sub-arrays 23 are arranged in one memory cell array 5.

Figure 3:
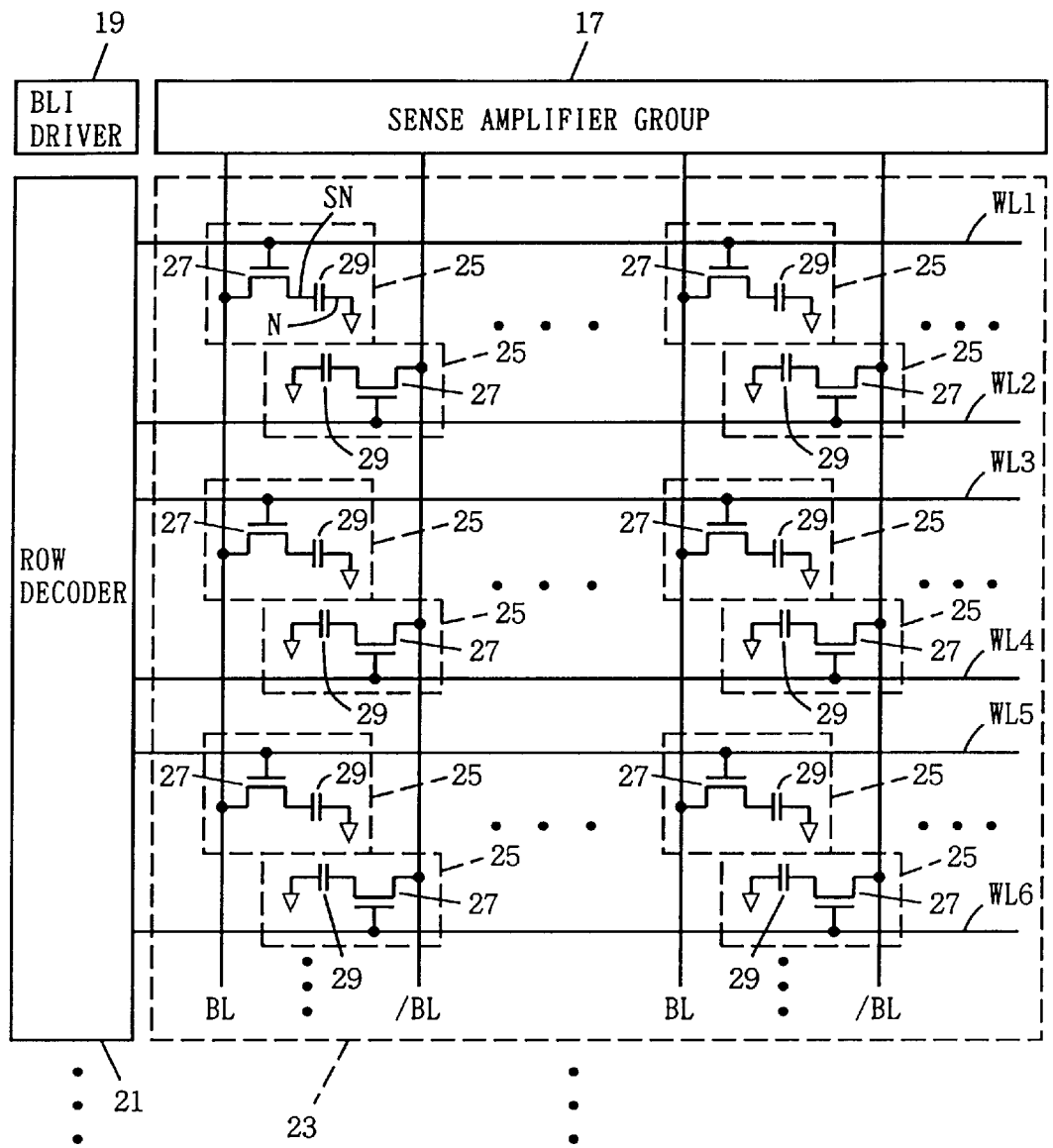
FIG. 3 is a circuit diagram specifically showing a sub-array in FIG. 2.

Referring to FIG. 3, sub-array 23 in FIG. 2 will be described below in detail. The same portions as those in FIG. 2 bear the same reference numbers, and will not be described below. In FIG. 3, sub-array 23 includes a plurality of memory cells 25 arranged in a matrix form of rows and columns. Sub-array 23 also includes a plurality of word lines WL1–WL6, . . . arranged correspondingly to the plurality of rows, respectively, and a plurality of bit line pairs BL and /BL arranged correspondingly to the plurality of columns, respectively. Each of word lines WL1–WL6, . . . is connected to memory cells 25 in the corresponding row. Each bit line pair BL and /BL is connected to memory cells 25 in the corresponding column. Each memory cell 25 is formed of memory cell transistor 27 and memory cell capacitor 29.

Description will now be given particularly on memory cells 25 connected to word line WL1. Memory cell transistor 27 is arranged between corresponding bit line BL and storage node SN, and has a gate connected to word line WL1. Memory cell capacitor 29 is arranged between storage node SN and a node N supplied with a cell plate voltage Vcp. When the potential on storage node SN is set to H-level, this means that high data (i.e., data of "1") is to be written. When the potential on storage node SN is set to L-level, this means that low data (i.e., data of "0") is to be written. Here, memory cell transistor 27 is an NMOS transistor and may also be referred to as a transfer gate.

In a test mode for detecting an H→L error such as a pause refresh failure or a disturb refresh failure according to this embodiment, and particularly for writing high data into the memory cell, the potential on the storage node of the memory cell is set to a level lower than that in the case of writing high data into the memory cell in the normal mode.

Thus, in the operation of writing high data into the memory cell in the test mode for detecting the H→L error according to this embodiment, the word line is supplied with the voltage at a level lower than that in the case of writing high data into the memory cell in the normal mode. An example will now be described below, and more specifically, description will be given on a test mode for detecting a pause refresh failure and a disturb refresh failure.

A method of detecting a pause refresh failure will now be described below with reference to sub-array 23 shown in FIG. 3. First, high data is written into all memory cells 25. In this operation, each of word lines WL1–WL6, . . . is supplied with a voltage at a lower level than that in the case of writing in the normal mode. In the embodiment 1, word lines WL1–WL6, . . . are supplied with power supply voltage Vcc in the test mode, and are supplied with boosted voltage Vpp in the normal mode. The level of boosted voltage Vpp is not lower than (Vcc+Vthm) level and (Vcc+Vthn) level, assuming that memory cell transistor 27 has a threshold voltage of Vthm, and NMOS transistors which form a connection circuit for connecting I/O lines IO and /IO to data lines D and /D, respectively, and will be described later, have a threshold voltage of Vthn. For the operation of writing high data, therefore, the potential on storage node SN of memory cell 25 is set to the level of (Vcc−Vthm) in the test mode, and is set to the level of Vcc in the normal mode, when bit lines BL and /BL are supplied with power supply voltage Vcc.

Second, the DRAM is left for a predetermined time. During this, electric charges flow out from storage node SN due to an N-P junction leak current between storage node SN in memory cell 25 and the substrate, and thereby the pause refresh failure occurs. Third, data is read from all memory cells 25. It is determined whether the data thus read has erroneously changed into low data.

A method of detecting a disturb refresh failure will now be described below in connection with sub-array 23 shown in FIG. 3. First, high data is written into all memory cells 25. This writing of high data is the same as that for the detection of the pause refresh failure. Second, data is read from memory cells connected to one word line WL. Since memory cells 25 have held the high data, the potentials on bit lines BL are set to power supply voltage Vcc level by sense amplifier group 17, and the potentials on bit lines /BL are set to ground voltage GND level by sense amplifier group 17. Therefore, memory cells 25 which are connected to word lines WL2–WL6, . . . (GND level) other than word line WL1 (Vcc level) and are also connected to bit lines /BL reaches such a state that the disturb refresh failure is likely to occur. Third, all memory cells 25 are refreshed. Thereby, low data is written into memory cells 25 in which the disturb refresh failure is present.

The second and third processes described above are repetitively effected on all the other word lines WL2–WL6, . . . . Finally, data is read from all memory cells 25. It is determined whether the data thus read has erroneously changed into low data. The mode for detecting an H→L error such as a pause refresh failure or a disturb refresh failure is called a test mode.

According to the DRAM of the embodiment 1, as described above, the voltage at a lower level than that in the normal mode is applied onto word lines WL1–WL6, . . . in the test mode for writing high data into memory cells 25. Therefore, the potential on storage node SN of the memory cell 25 in the test mode is lower than that in the normal mode. Therefore, it is possible to reduce a time before the H→L error occurs, and the test time can be reduced, so that failure detection can be performed efficiently.

Figure 4:
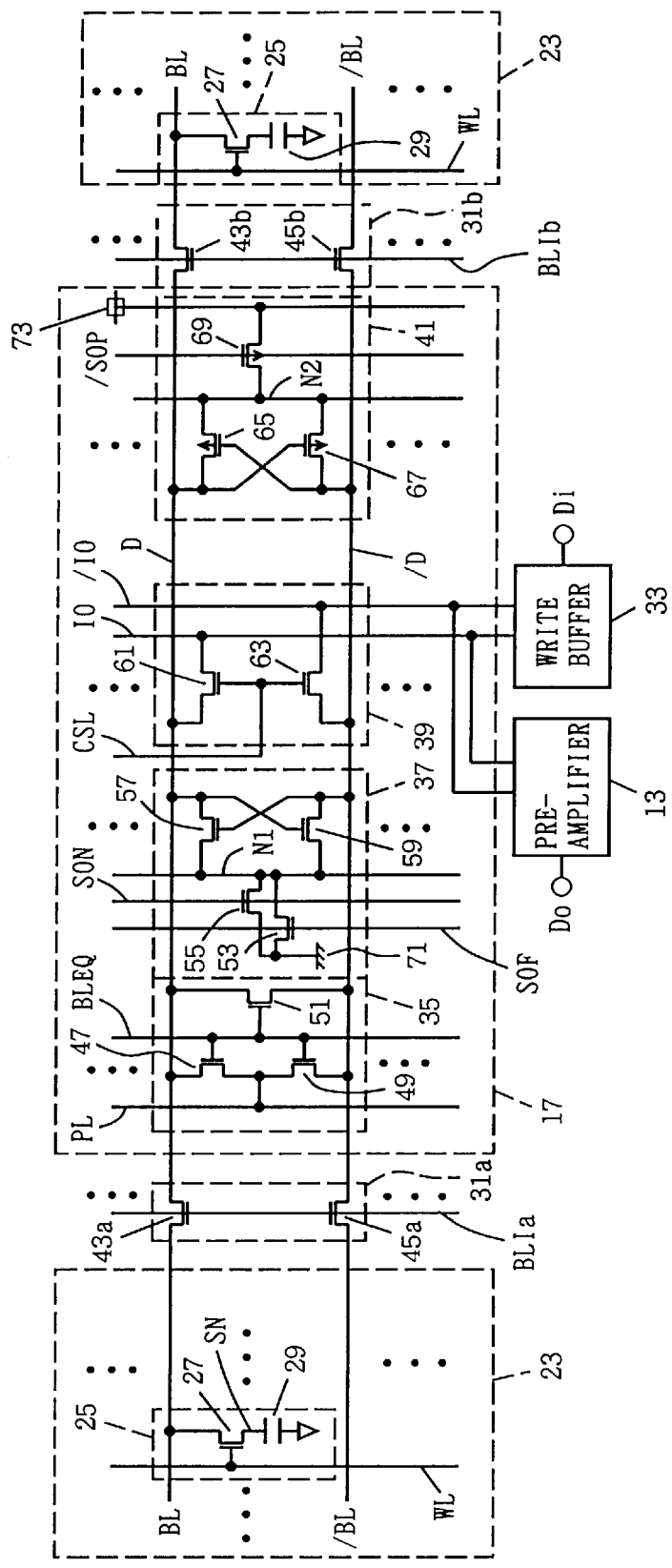
FIG. 4 is a circuit diagram showing a sense amplifier group, sub-arrays and their peripheral circuits in FIG. 2.

The first process in the test mode described above, i.e., writing of high data into memory cells 25 will now be described below in detail. First, writing of high data will be describe below with reference to FIG. 4. The same portions as those in FIGS. 1 to 3 bear the same reference numbers, and will not be described below. Referring to FIG. 4, a connection circuit 31a is arranged between a sense amplifier group 17 and one of sub-arrays 23. A connection circuit 31b is arranged between sense amplifier group 17 and the other sub-array 23. Connection circuit 31a is formed of NMOS transistors 43a and 45a. Connection circuit 31b is formed of NMOS transistors 43b and 45b. Sense amplifier group 17 includes equalize/precharge circuits 35, N-channel sense amplifiers 37, connection circuits 39 and P-channel sense amplifiers 41.

Equalize/precharge circuits 35, N-channel sense amplifiers 37, connection circuits 39 and P-channel sense amplifiers 41 are arranged correspondingly to the plurality of bit line pairs BL and /BL of sub-arrays 23. Sense amplifier group 17 is commonly used by one and the other sub-arrays 23. Equalize/precharge circuit 35 is formed of NMOS transistors 47, 49 and 51. N-channel sense amplifier 37 is formed of NMOS transistors 53, 55, 57 and 59. Connection circuit 39 is formed of NMOS transistors 61 and 63. P-channel sense amplifier 41 is formed of PMOS transistors 65, 67 and 69.

NMOS transistor 43a of connection circuit 31a is arranged between bit line BL of one of sub-arrays 23 and data line D. NMOS transistor 45a is arranged between bit line /BL and data line /D. Gates of NMOS transistors 43a and 45a are connected to bit line isolating signal line BLIa. NMOS transistor 43b of connection circuit 31b is arranged between bit line BL of the other sub-array 23 and data line D. NMOS transistor 45b is arranged between bit line /BL and data line /D. Gates of NMOS transistors 43b and 45b are connected to bit line isolating signal line BLIb.

NMOS transistors 47 and 49 of equalize/precharge circuit 35 are connected in series between data lines D and /D. A connection between NMOS transistors 47 and 49 is connected to a precharge voltage supply line PL. NMOS transistor 51 is arranged between data lines D and /D. Gates of NMOS transistors 47, 49 and 51 are connected to an equalize/precharge signal line BLEQ.

NMOS transistors 55 and 53 of N-channel sense amplifier 37 are connected in parallel between a node supplied with ground voltage GND from a ground 71 and a node N1. A gate of NMOS transistor 53 is connected to a sense amplifier control signal line SOF. A gate of NMOS transistor 55 is connected to a sense amplifier control signal line SON. NMOS transistor 57 is arranged between node N1 and data line D, and has a gate connected to data line /D. NMOS transistor 59 is arranged between node N1 and data line /D, and has a gate connected to data line D.

NMOS transistor 61 of connection circuit 39 is arranged between data line D and I/O line IO, and has a gate connected to a column select line CSL. NMOS transistor 63 is connected between data line /D and I/O line /IO, and has a gate connected to column select line CSL. I/O lines IO and /IO are connected to preamplifier 13 and a write buffer 33. PMOS transistor 69 of P-channel sense amplifier 41 is arranged between a node supplied with power supply voltage Vcc from a Vcc power supply 73 and a node N2, and has a gate connected to a sense amplifier control signal line /SOP. PMOS transistor 65 is arranged between data line D and node N2, and has a gate connected to data line /D. PMOS transistor 67 is arranged between node N2 and data line /D, and has a gate connected to data line D.

Precharge voltage supply line PL is supplied with a precharge voltage for precharging bit lines BL and /BL. Equalize/precharge signal line BLEQ is supplied with an equalize/precharge signal BLEQ. Sense amplifier control signal line SOF receives a sense amplifier control signal SOF. Sense amplifier control signal line SON receives a sense amplifier control signal SON. Column select line CSL receives a column select signal from corresponding column decoder 11 (see FIG. 1). Sense amplifier control signal line /SOP receives a sense amplifier control signal /SOP. Bit line isolating signal line BLIa receives a bit line isolating signal BLIa. Bit line isolating signal line BLIb receives a bit line isolating signal BLIb.

Figure 5:
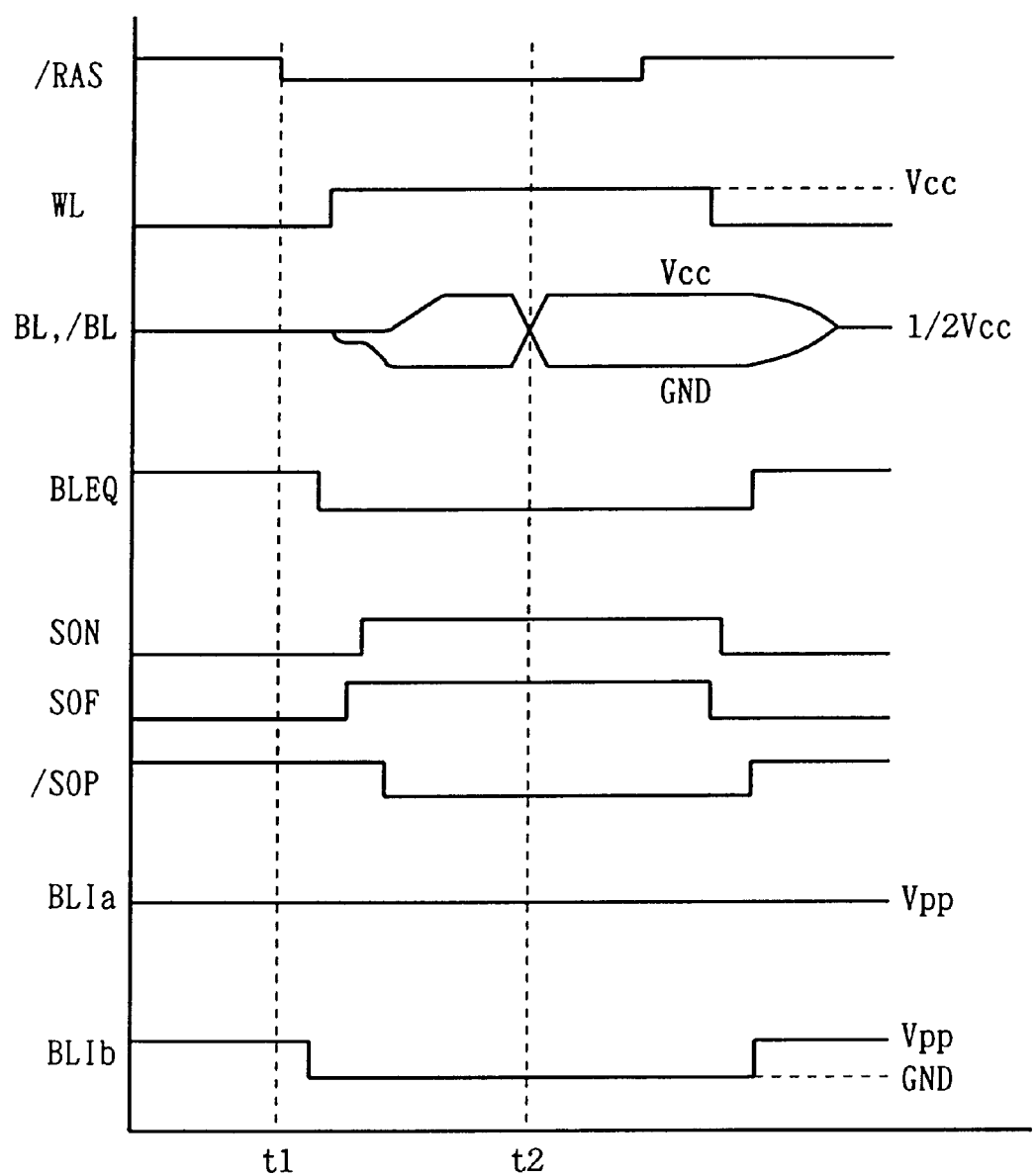
FIG. 5 is a timing chart showing an operation of the DRAM according to the embodiment 1 of the invention, and particularly writing of high data in a test mode.

Referring to FIGS. 4 and 5, writing of high data in the test mode will be described below. More specifically, description will now be given on the case where low data are held in memory cells 25 in sub-array 23 connected to connection circuit 31a and high data are to be written. Further specifically, an operation will be described in connection with memory cells 25 connected to bit line BL. Before time t1, i.e., before transition of a row address strobe signal /RAS to L-level, equalize/precharge signal BLEQ, sense amplifier control signal /SOP and bit line isolating signals BLIa and BLIb are at H-level, and sense amplifier control signals SON and SOF are at L-level. Thus, before time t1, connection circuits 31a and 31b and equalize/precharge circuit 35 are active, and N-channel sense amplifier 37 and P-channel sense amplifier 41 are inactive. Column select line CSL is at L-level, and connection circuit 39 is inactive.

At time t1, row address strobe signal /RAS changes to L-level. Thereafter, bit line isolating signal BLIb, equalize/precharge signal BLEQ and sense amplifier control signal /SOP change to L-level, and the potential on word line WL as well as sense amplifier control signals SON and SOF change to H-level. Thus, equalize/precharge circuit 35 and connection circuit 31b are deactivated, and N-channel sense amplifier 37 and P-channel sense amplifier 41 are activated. Thereby, sub-array 23 connected to the connection circuit 31b is isolated from sense amplifier group 17. Further, low data held in memory cells 25 in sub-array connected to connection circuit 31a are read out, so that the potential on bit line BL attains GND level, and the potential on bit line /BL attains Vcc level.

At time t2, column decoder 11 in FIG. 1 sets column select line CSL to H-level, so that NMOS transistors 61 and 63 are turned on. Write buffer 33 applies boosted voltage Vpp onto I/O line IO in accordance with input data Di, and applies ground voltage GND onto I/O line /IO. Thereby, the potential on bit line BL connected to connection circuit 31a is set to Vcc level, and the potential on bit line /BL is set to GND level. Since word line WL is at H-level, high data is written into memory cells 25 in sub-array 23 connected to connection circuit 31a. Since word line WL is supplied with power supply voltage Vcc, the potential on storage node SN of memory cell 25 is set to (Vcc−Vthm) level.

Writing of high data in the normal mode will be described below. The write operation in the normal mode differs from that in the test mode in the level of voltage applied onto word line WL. More specifically, a boosted voltage is applied onto selected word line WL in the normal mode. Therefore, the potential on storage node SN of memory cell 25 is set to Vcc level. Preamplifier 13 is used in the read operation, and operates to amplify differentially the potential difference on I/O line pair IO and /IO for externally outputting it as output data Do.

Figure 6:
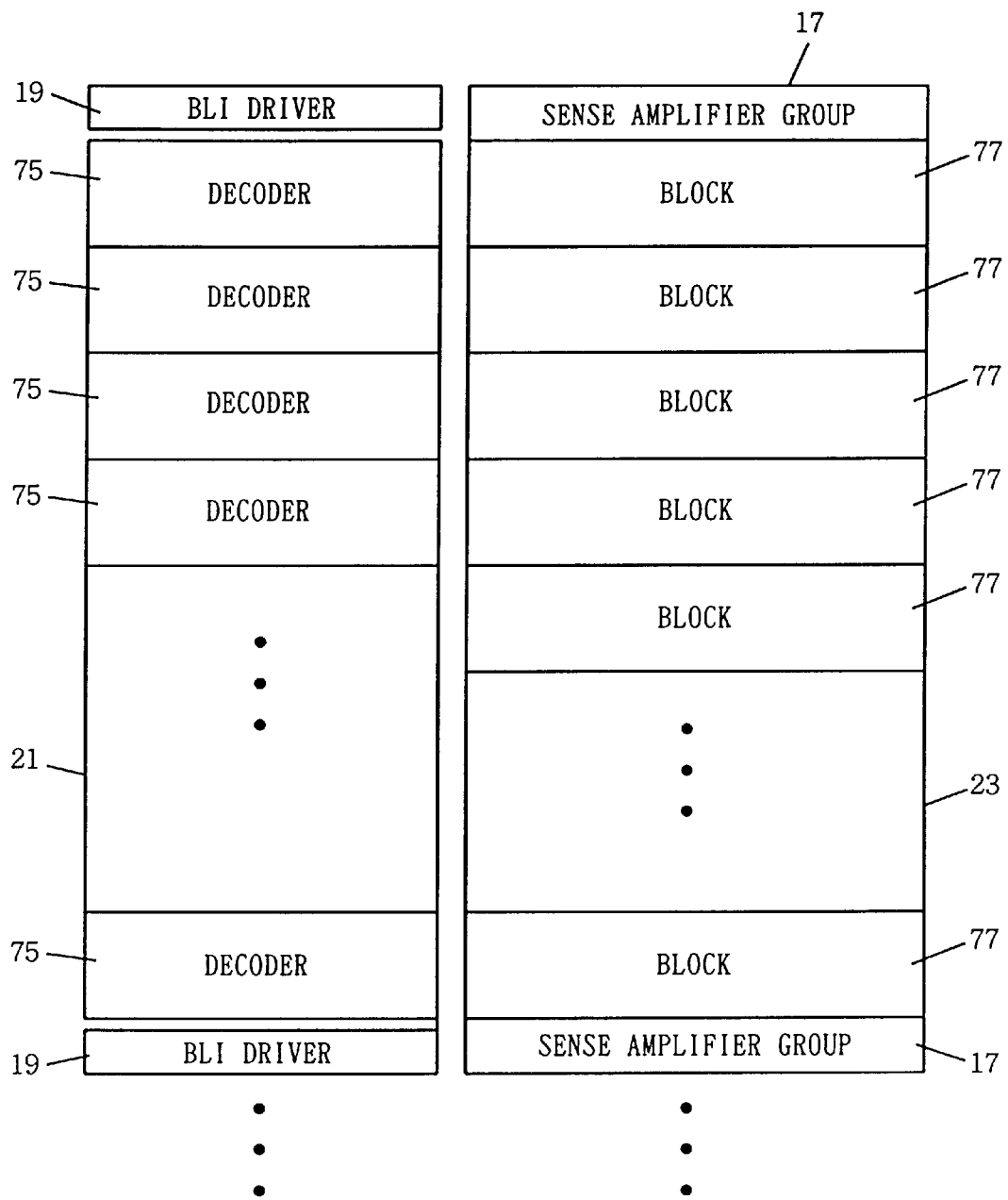
FIG. 6 is a schematic block diagram showing a row decoder and a sub-array in FIG. 2.

Referring to FIG. 6, BLI driver 19, row decoder 21, sense amplifier group 17 and sub-array 23 shown in FIG. 2 will now be described below. The same portions as those in FIG. 2 bear the same reference numbers, and will not be described below. In FIG. 6, one row decoder includes 16 decoders 75. One sub-array 23 is divided into 16 blocks 77. Therefore, each block 77 has 16 word lines.

Figure 7:
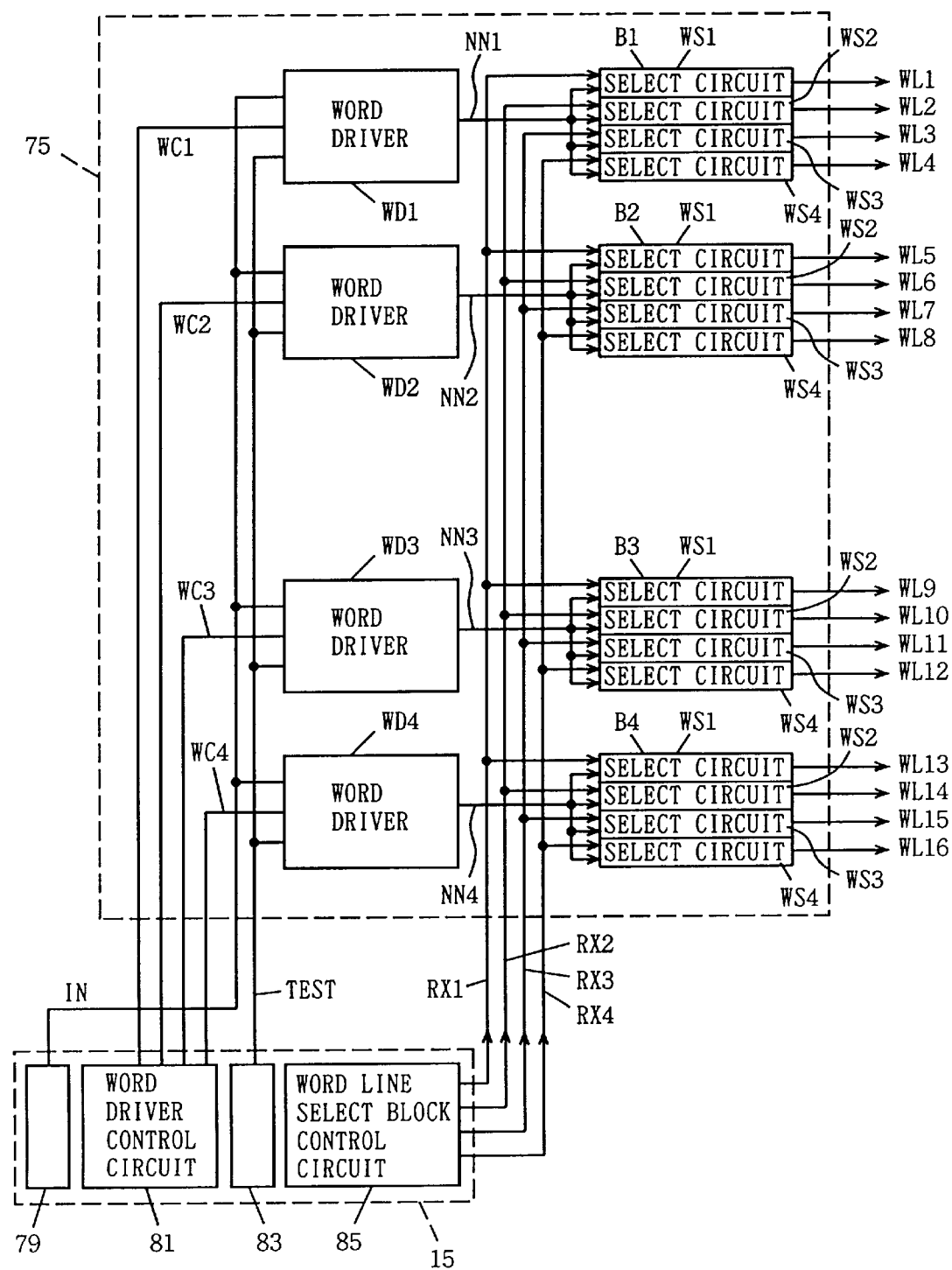
FIG. 7 is a schematic block diagram showing a control circuit 15 in FIG. 1 and a row decoder in FIG. 6.

Referring to FIG. 7, control circuit 15 in FIG. 1 and row decoder 75 in FIG. 6 will now be described below. The same portions as those in FIGS. 1 and 6 bear the same reference numbers, and will not be described below. In FIG. 7, control circuit 15 includes an IN signal generating circuit 79, a word driver control circuit 81, a TEST signal generating circuit 83 and a word line select block control circuit 85. Decoder 75 includes word drivers WD1, WD2, WD3 and WD4 as well as word line select blocks B1, B2, B3 and B4. Each of word line select blocks B1–B4 includes select circuits WS1, WS2, WS3 and WS4.

Each of word drivers WD1–WD4 receives a precharge signal IN for the row decoder and a first test mode entry signal TEST1. Word drivers WD1–WD4 receive word driver select signals WC1–WC4, respectively. Output nodes NN1–NN4 of word drivers WD1–WD4 are connected to select circuits WS1–WS4 in corresponding word line select blocks B1–B4, respectively. Select circuits WS1–WS4 in word line select block B1 are connected to word lines WL1–WL4, respectively. Select circuits WS1–WS4 in word line select block B2 are connected to word lines WL5–WL8, respectively. Select circuits WS1–WS4 in word line select block B3 are connected to word lines WL9–WL12, respectively. Select circuits WS1–WS4 in word line select block B4 are connected to word lines WL13–WL16, respectively. A select circuit select signal RX1 issued from word line select block control circuit 85 is applied to select circuit WS1 in each of blocks B1–B4, and a select circuit select signal RX2 is applied to select circuit WS2 in each of blocks B1–B4. A select circuit select signal RX3 is applied to select circuit WS3 in each of blocks B1–B4, and a select circuit select signal RX4 is applied to select circuit WS4 in each of blocks B1–B4.

The structure in FIG. 7 has been described particularly in connection with one decoder 75. Then, description will be given in connection with all decoders 75 included in one memory cell array 5 (see FIG. 1). Precharge signal IN for the row decoder and first test mode entry signal TEST1 are applied to all word drivers WD1–WD1024 in one memory cell array 5. Word drivers WD1–WD1024 are supplied with word driver select signals WC1–WC1024, respectively. Output nodes NN1–NN1024 of word drivers WD1–WD1024 are connected to select circuits WS1–WS4 in corresponding word line select blocks B1–B1024, respectively.

Select circuit select signal RX1 is connected to select circuits WS1 in word line select blocks B1–B1024, and select circuit select signal RX2 is connected to select circuits WS2 in word line select blocks B1–B1024. Select circuit select signal RX3 is connected to select circuits WS3 in word line select blocks B1–B1024, and select circuit select signal RX4 is connected to select circuits WS4 in word line select blocks B1–B1024. Select circuits WS1–WS4 in word line select blocks B1–B1024 are connected to corresponding word lines WL1–WL4096, respectively.

Decoder 75 in FIG. 7 will be discussed again. IN signal generating circuit 79 sets (i.e., activates) precharge signal IN for the row decoder to H-level when row address strobe signal /RAS attains L-level and memory cell array 5 (see FIG. 1) is selected. Word driver control circuit 81 sets (i.e., activates) word driver select signals WC1–WC4 corresponding to word drivers WD1–WD4 to be selected to H-level in accordance with row address strobe signal and the row address signal. Test signal generating circuit 83 sets (i.e., activates) first test mode entry signal TEST1 to H-level when the test mode is to be started. Word line select block control circuit 85 activates select circuit select signals RX1–RX4 corresponding to select circuits WS1–WS4 to be selected in accordance with row address strobe signal /RAS and the row address.

Word drivers WD1–WD4 issue power supply voltage Vcc to corresponding nodes NN1–NN4 when precharge signal IN for the row decoder, first test entry signal TEST1 and corresponding word driver select signals WC1–WC4 attain H-level. When precharge signal IN for the row decoder and corresponding word driver select signals WC1–WC4 are at H-level, and first test mode entry signal TEST1 is at L-level, word drivers WD1–WD4 issue boosted voltage Vpp to corresponding nodes NN1–NN4, respectively. When precharge signal IN for the row decoder is at L-level, word drivers WD1–WD4 issue ground voltage GND to corresponding nodes NN1–NN4, respectively.

Word drivers WD1–WD4 issue ground voltage GND to corresponding nodes NN1–NN4, respectively, when precharge signal IN for the row decoder is at H-level and the corresponding word driver select signals WC1–WC4 are at L-level. Select circuits WS1–WS4 are activated when corresponding select circuit select signals RX1–RX4 are activated, respectively. Activated select circuits WS1–WS4 in word line select blocks B1–B4 transmit the potentials on corresponding nodes NN1–NN4 onto corresponding word lines WL1–WL16, respectively. Inactivated select circuits WS1–WS4 in word line select blocks B1–B4 transmit ground voltage GND onto corresponding word lines WL1–WL16, respectively.

Figure 8:
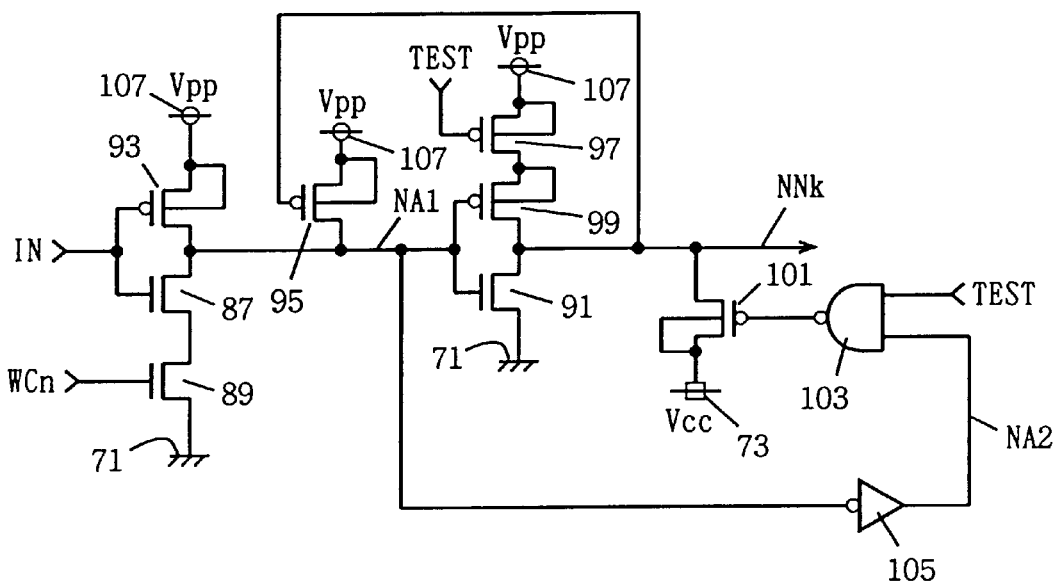
FIG. 8 is a circuit diagram specifically showing a word driver in FIG. 7.

Referring to FIG. 8, each of word drivers WD1–WD4 in FIG. 7 will now be described below in detail. Referring to FIG. 8, the word driver includes NMOS transistors 87, 89 and 91, PMOS transistors 93, 95, 97, 99 and 101, an NAND circuit 103 and an inverter 105. PMOS transistor 93 and NMOS transistors 87 and 89 are connected in series between a node supplied with boosted voltage Vpp from a Vpp power supply 107 and a node supplied with ground voltage GND from ground 71. PMOS transistor 93 and NMOS transistor 87 are supplied on their gates with precharge signal IN for the row decoder. NMOS transistor 89 is supplied on its gate with word driver select signal WCn (n is a natural number). PMOS transistor 95 is arranged between a node supplied with boosted voltage Vpp from Vpp power supply 107 and a node NA1, and has a gate connected to a node NNk (k is a natural number). PMOS transistors 97 and 99 and NMOS transistor 91 are connected in series between a node supplied with boosted voltage Vpp from Vpp power supply 107 and a node supplied with ground voltage GND from ground 71.

PMOS transistor 97 is supplied on its gate with first test entry signal TEST1. Gates of PMOS transistor 99 and NMOS transistor 91 are connected to node NA1. PMOS transistor 101 is arranged between node NNk and a node supplied with power supply voltage Vcc from Vcc power supply 73, and has a gate connected to an output node of NAND circuit 103. First test mode entry signal TEST1 is supplied to one of input nodes of NAND circuit 103, and the other input node thereof is connected to a node NA2. Inverter 105 is arranged between nodes NA1 and NA2. When n is 1 and k is 1, the word driver in FIG. 8 represents word driver WD1 in FIG. 7.

Figure 9:
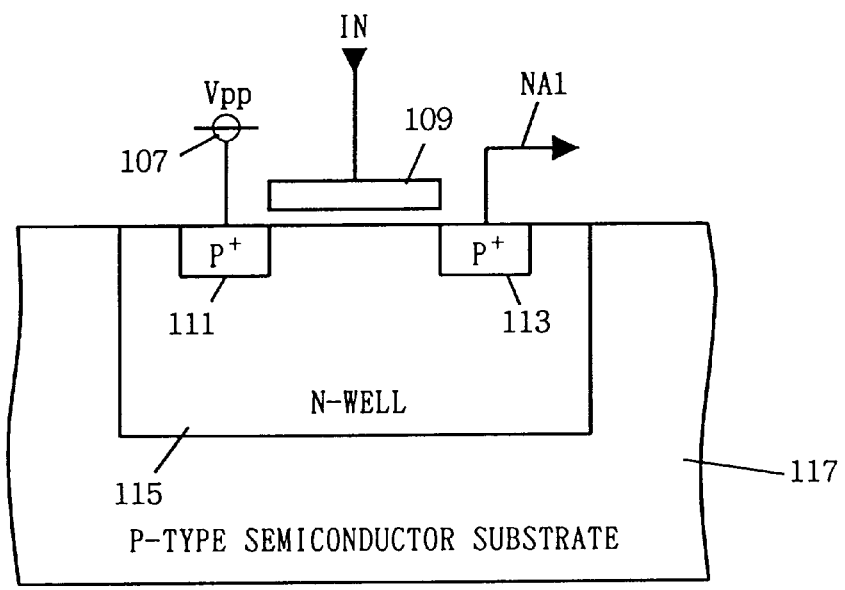
FIG. 9 shows a structure of a PMOS transistor 93 in FIG. 8.

Referring to FIG. 9, a structure of PMOS transistor 93 in FIG. 8 will be described below. The same portions as those in FIG. 8 bear the same reference numbers, and will not be described below. Referring to FIG. 9, this PMOS transistor has a gate 109 receiving precharge signal IN for the row decoder, a P+ layer 111 which serves as source/drain and receiving boosted voltage Vpp from Vpp power supply 107, and a P+ layer 113 which serves as drain/source and is connected to node NA1. P+ layers 111 and 113 are formed in an N-well 115. N-well 115 is formed in a P-type semiconductor substrate 117. Structures of PMOS transistors 95 to 101 are similar to that of PMOS transistor in FIG. 9.

Figure 10:
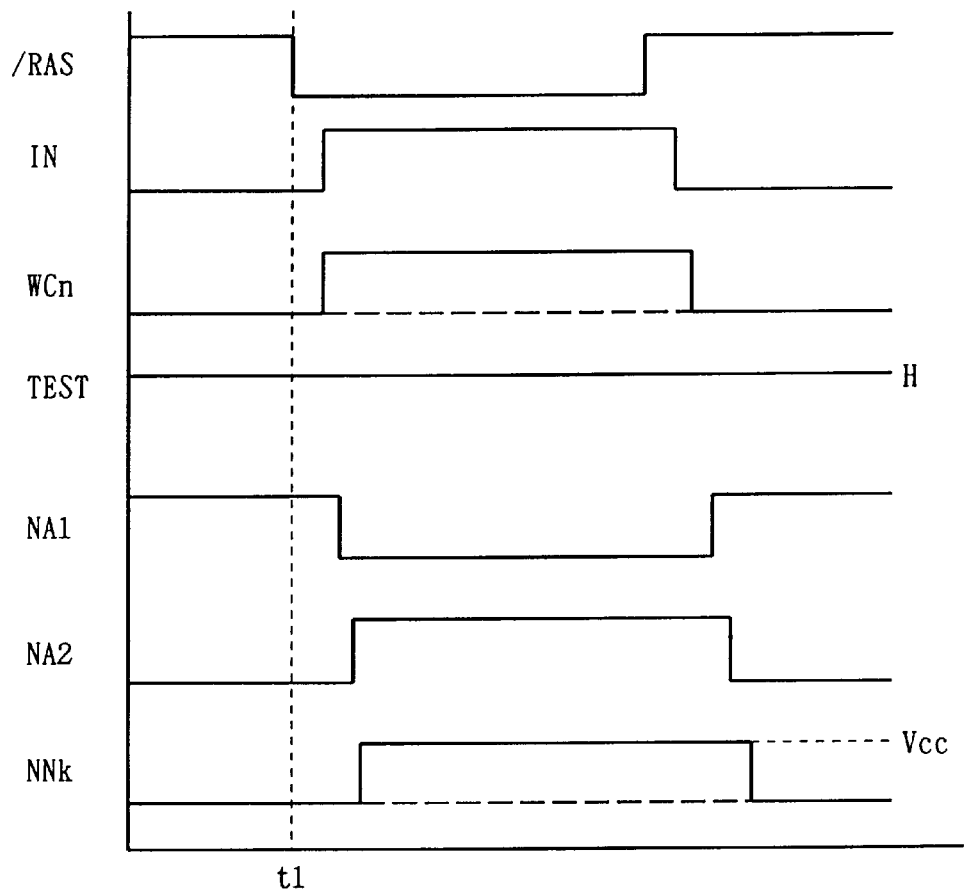
FIG. 10 is a timing chart showing an operation of a word driver in FIG. 8.

Referring to FIGS. 8 and 10, an operation of the word driver in the test mode will be described below. Since the test mode has already started, first test mode entry signal TEST1 is also at H-level. Before time t1, i.e., when row address strobe signal /RAS is at H-level, precharge signal IN and word driver select signal WCn are at L-level. Therefore, the potential on node NA1 is at H-level. Accordingly, NMOS transistor 91 is on, and the potential on node NNk is at GND level. Since the potential on node NA2 is at L-level, PMOS transistor 101 is off.

After row address strobe signal /RAS changed to L-level at time t1, precharge signal IN for the row decoder and word driver select signal WCn changes to H-level. Therefore, the potential on node NA1 attains L-level. Accordingly, the potential on node NA2 attains H-level, so that PMOS transistor 101 is turned on because first test mode entry signal TEST1 is also at H-level. Thereby, the potential on node NNk attains Vcc level. Since first test mode entry signal TEST1 is at H-level, PMOS transistor 97 is off. In the normal mode, first test mode entry signal TEST1 is at L-level, so that PMOS transistors 97 and 99 are turned on and the potential on node NNk attains Vpp level when precharge signal IN for the row decoder and word driver select signal WCn attain H-level.

Figure 11:
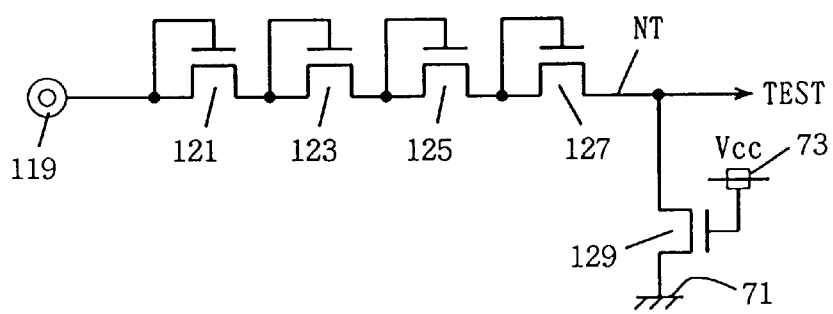
FIG. 11 is a circuit diagram specifically showing a TEST signal generating circuit 83 in FIG. 7.

Referring to FIG. 11, TEST signal generating circuit 83 in FIG. 7 will now be described below in detail. In FIG. 11, TEST signal generating circuit 83 is formed of NMOS transistors 121, 123, 125, 127 and 129. NMOS transistors 121–127 are connected in series between a pin 119 and a node NT. Each of NMOS transistors 121–127 is diode-connected. NMOS transistor 129 is arranged between node NT and a node supplied with ground voltage GND from ground 71, and has a gate connected to a node supplied with power supply voltage Vcc from Vcc power supply 73. Pin 119 may be a dedicated pin or an unoccupied pin in a conventional package. NMOS transistor 129 has a gate length longer than that of a usual NMOS transistor such as NMOS transistor 121.

When the test mode is to be started, a voltage at power supply voltage Vcc level or higher is applied to pin 119. Thereby, the potential on node NT attains H-level. Thus, first test mode entry signal TEST1 issued from node NT attains H-level. In the normal mode, the potential on node NT is fixed at the GND level, and first test mode entry signal TEST1 is set to L-level.

Figure 12:
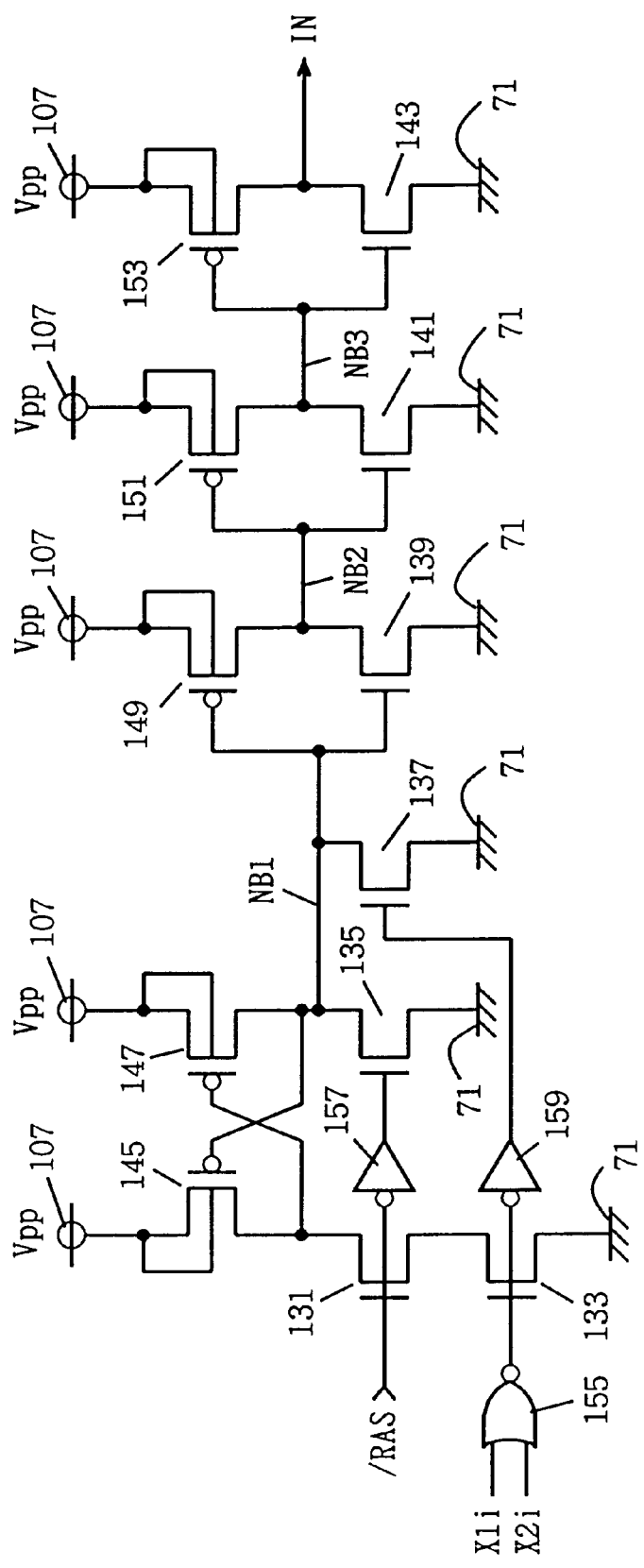
FIG. 12 is a circuit diagram specifically showing an IN signal generating circuit 79 in FIG. 7.

Referring to FIG. 12, IN signal generating circuit 79 in FIG. 7 will be described below more in detail. In FIG. 12, the IN signal generating circuit includes NMOS transistors 131, 133, 135, 137, 139, 141 and 143, PMOS transistors 145, 147, 149, 151 and 153, an NOR circuit 155 and inverters 157 and 159.

PMOS transistor 145 and NMOS transistors 131 and 133 are connected in series between a node supplied with boosted voltage Vpp from Vpp power supply 107 and a node supplied with ground voltage GND from ground 71. A gate of PMOS transistor 145 is connected to a node NB1. NMOS transistor 131 is supplied on its gate with row address strobe signal /RAS. A gate of NMOS transistor 133 is connected to an output node of NOR circuit 155. NOR circuit 155 is supplied on one of its input nodes with a signal X1i (i=1, 2, 3, 4) and is also supplied on the other input node with a signal X2i (i=1, 2, 3, 4).

PMOS transistor 147 and NMOS transistor 135 are connected in series between a node supplied with boosted voltage Vpp from Vpp power supply 107 and a node supplied with ground voltage GND from ground 71. A gate of PMOS transistor 147 is connected to a drain of NMOS transistor 131. A gate of NMOS transistor 135 is connected to an output node of inverter 157. Inverter 157 is supplied, on its input node, with row address strobe signal /RAS. Inverter 159 is arranged between an output node of NOR circuit 155 and a gate of NMOS transistor 137. NMOS transistor 137 is arranged between node NB1 and a node supplied with ground voltage GND from ground 71.

PMOS transistor 149 and NMOS transistor 139 are connected in series between a node supplied with boosted voltage Vpp from Vpp power supply 107 and a node supplied with ground voltage GND from ground 71. Gates of NMOS transistor 139 and PMOS transistor 149 are connected to node NB1. PMOS transistor 151 and NMOS transistor 141 are connected in series between a node supplied with boosted voltage Vpp from Vpp power supply 107 and a node supplied with ground voltage GND from ground 71. Gates of PMOS transistor 151 and NMOS transistor 141 are connected to node NB2. PMOS transistor 153 and NMOS transistor 143 are connected in series between a node supplied with boosted voltage Vpp from Vpp power supply 107 and a node supplied with ground voltage GND from ground 71. Gates of PMOS transistor 153 and NMOS transistor 143 are connected to node NB3. A drain of NMOS transistor 143 is connected to a node issuing precharge signal IN for the row decoder.

Structures of PMOS transistors 145 to 153 are similar to that of the PMOS transistor shown in FIG. 9. Signals X1i and X2i are employed for selecting one from four memory cell arrays 5 (see FIG. 7). When signals X1i and X2i are at L-level, corresponding memory cell array 5 is unselected. When signal X1i is at H-level and signal X2i are at L-level, corresponding memory cell array 5 is selected. IN signal generating circuit 79 (see FIG. 7) corresponding to first memory cell array 5 is supplied with signals X11 and X21, and IN signal generating circuit 79 corresponding to second memory cell array 5 is supplied with signals X12 and X22. IN signal generating circuit 79 corresponding to third memory cell array 5 is supplied with signals X13 and X23, and IN signal generating circuit 79 corresponding to fourth memory cell array 5 is supplied with signals X14 and X24.

Figure 13:
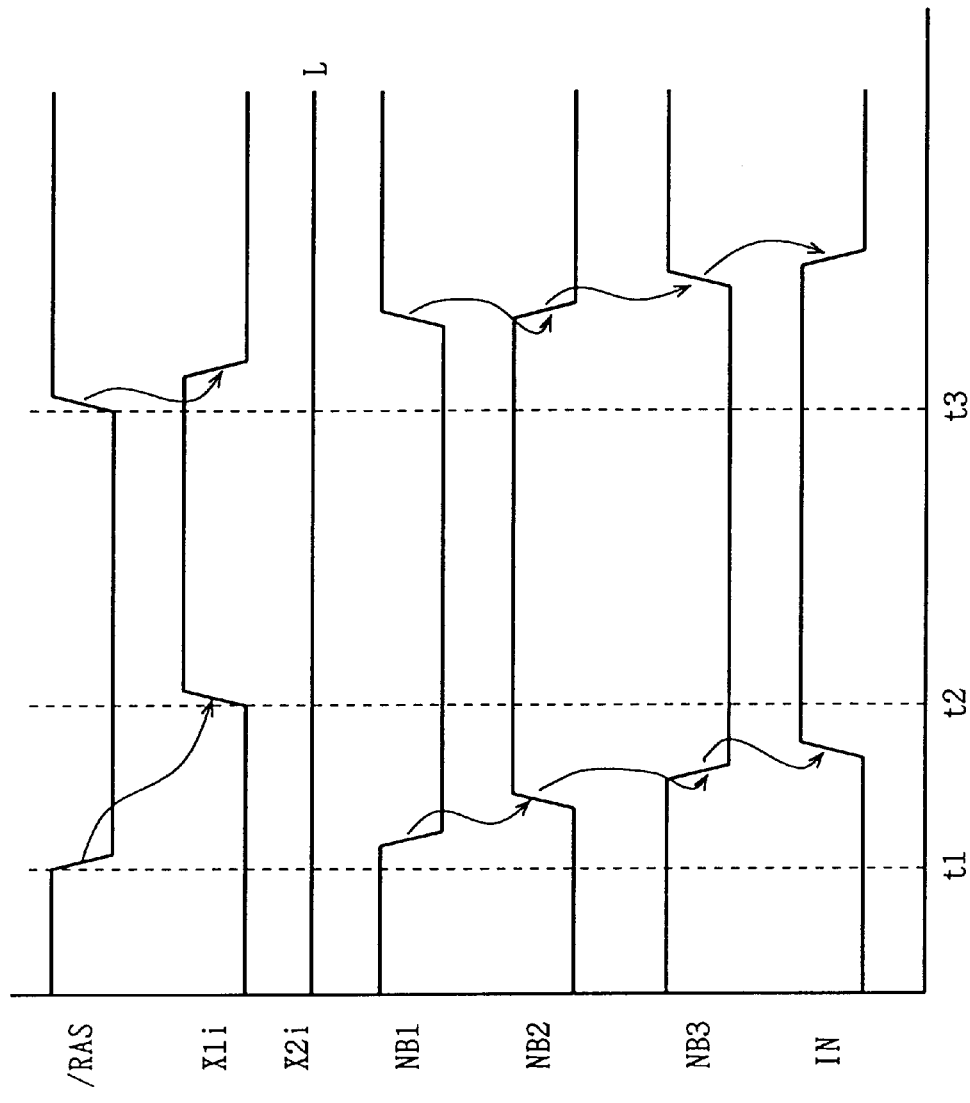
FIG. 13 is a timing chart showing an operation of the IN signal generating circuit in FIG. 12.

Referring to FIGS. 12 and 13, row address strobe signal /RAS is at H-level and signals X1i and X2i are at L-level before time t1. Therefore, NMOS transistors 131 and 133 as well as PMOS transistor 147 are on. Thereby, the potential on node NB1 attains H-level, the potential on node NB2 attains L-level, and the potential on node NB3 attains H-level. Therefore, NMOS transistor 143 is turned on, and precharge signal IN for the row decoder attains L-level.

When row address strobe signal /RAS attains L-level at time t1, NMOS transistor 135 is turned on, and the potential on node NB1 attains L-level. Therefore, the potential on node NB2 attains H-level, and the potential on node NB3 attains L-level, so that the precharge signal IN for the row decoder attains H-level. At time t2, signal X1i attains H-level. After row address strobe signal /RAS attains H-level at time t3, signal X1i attains L-level. Thereby, NMOS transistors 131 and 133 as well as PMOS transistor 147 are turned on, so that the potential on node NB1 attains H-level, the potential on node NB2 attains L-level and the potential on node NB3 attains H-level. Thereby, NMOS transistor 143 is turned on, and precharge signal IN for the row decoder attains L-level.

According to the DRAM of the embodiment 1, as described above, a voltage at a level lower than that in the normal mode is applied onto word line WL for writing high data into the memory cell. Therefore, the potential on storage node SN of the memory cell in the test mode is lower than that in the normal mode. Therefore, a time before an H→L error occurs is short, and the test time can be reduced. Thus, detection of a failure can be performed efficiently.

Embodiment 2

A whole structure of a DRAM of an embodiment 2 of the invention is similar to that of the DRAM in FIG. 1. Referring to FIG. 1, the row decoder and BLI driver 9 and memory cell array 5 in the DRAM of the embodiment 2 are similar to the row decoder and BLI driver 9 and memory cell array 5 in FIG. 2, respectively. Referring to FIG. 2, sub-array 23 in the DRAM of the embodiment 2 is similar to sub-array 23 in FIG. 3. Referring to FIG. 2, sense amplifier group 17 and its peripheral circuit in the DRAM of the embodiment 2 are similar to sense amplifier group 17 and its peripheral circuit in FIG. 4, respectively. Referring to FIG. 2, row decoder 21 and sub-array 23 in the DRAM of the embodiment 2 are similar to row decoder 21 and sub-array 23 in FIG. 6, respectively.

Referring to FIGS. 1 and 6, control circuit 15 and decoder 75 in the DRAM of the embodiment 2 are similar to control circuit 15 and decoder 75 in FIG. 7, respectively. However, word drivers WD1–WD4 in FIG. 7 are arranged in a different manner. More specifically, word drivers WD1–WD4 in the DRAM of the embodiment 1 apply power supply voltage Vcc to the selected word line, and apply thereto boosted voltage Vpp in the normal mode. In contrast to this, word drivers WD1–WD4 in the DRAM of the embodiment 2 apply boosted voltage Vpp to the selected word line in both the test mode and normal mode. Referring to FIG. 7, IN signal generating circuit 79 is similar to the IN signal generating circuit in FIG. 12. Referring to FIG. 7, TEST signal generating circuit 83 is similar to the TEST signal generating circuit 83 in FIG. 11.

In the test mode according to the embodiment for detecting an H→L error such as a pause refresh failure or a disturb refresh failure, writing of high data into the memory cell is performed in such a manner that the potential on the storage node of the memory cell is set to a level lower than that in the case of writing high data into the memory cell in the normal mode.

More specifically, in the test mode for detecting an H→L error in the DRAM of the embodiment 2, a voltage at a level lower than that in the normal mode is applied onto bit line isolating signal lines BLIa and BLIb (see FIG. 4). Further specifically, bit line isolating signal lines BLIa and BLIb (see FIG. 4) are supplied with power supply voltage Vcc in the test mode, and are supplied with boosted voltage Vpp in the normal mode. The mode for detecting the H→L error is specifically the mode for detecting the pause refresh failure already described in connection with the embodiment 1 or the disturb refresh failure, and will be discussed below more in detail.

Figure 14:
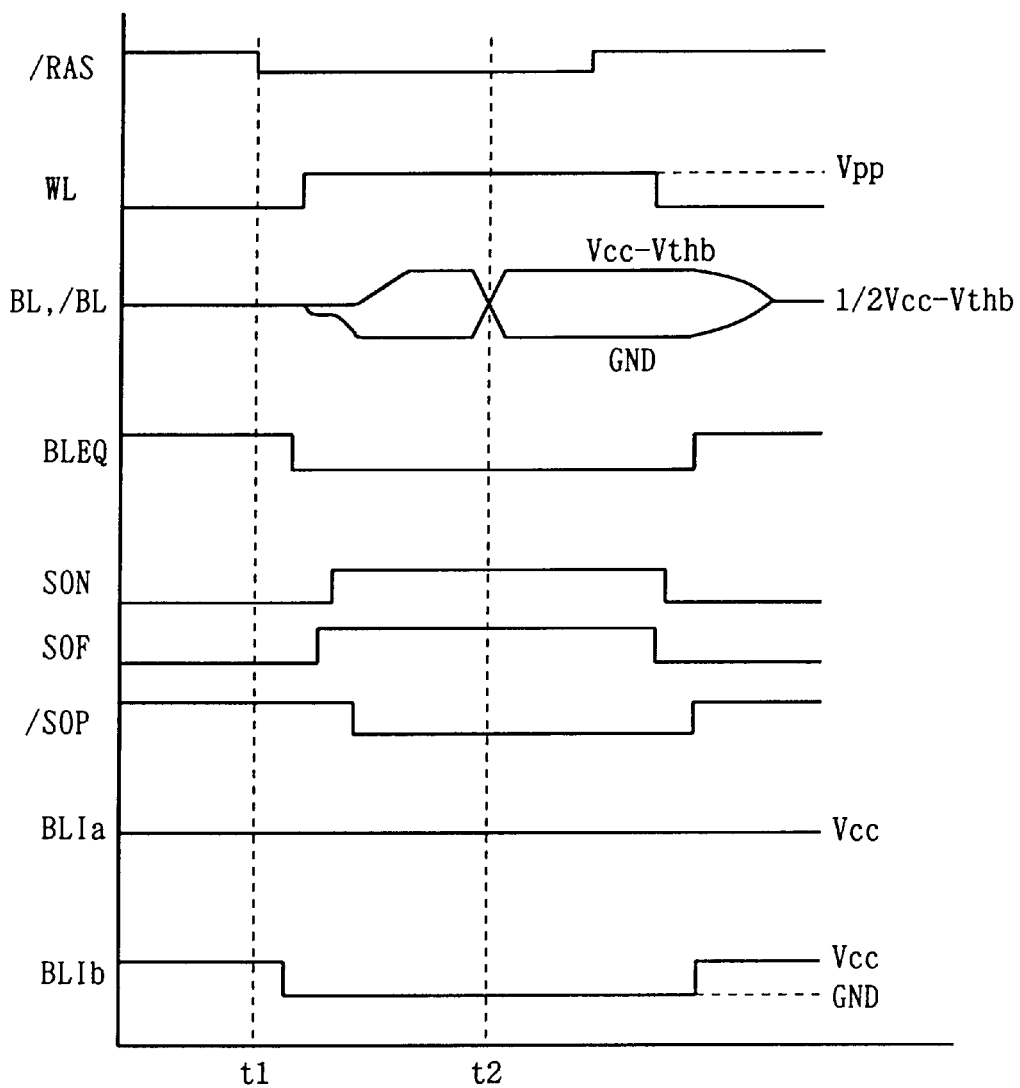
FIG. 14 is a timing chart showing an operation of a DRAM according to an embodiment 2 of the invention, and partially showing writing of high data in a test mode.

Referring to FIGS. 4 and 14, description will now be given on the case where high data is to be written into memory cell 25 of sub-array 23 connected to connection circuit 31a in the test mode. Description will also be given particularly in connection with the memory cell connected to bit line BL. It is assumed that low data is already written into memory cell 25. In the case of writing high data in the test mode, the DRAM of the embodiment 2 differs from the DRAM of the embodiment 1 in the levels of voltages applied onto bit line isolating signal lines BLIa and BLIb and word line WL as well as the potential difference appearing on bit line pair BL and /BL. The manners other than the above are the same. The difference will be described below.

Before time t1, power supply voltage Vcc is applied onto bit line isolating signal lines BLIa and BLIb. Therefore, bit lines BL and /BL are at (½ Vcc−Vthb) level, where Vthb represents threshold voltages of NMOS transistors 43a and 45a. At time t1, row address strobe signal /RAS attains L-level, and thereafter the potential on bit line isolating signal line BLIb is set to L-level. Sub-array 23 connected to connection circuit 31b is isolated from sense amplifier group 17. At time t2, write buffer 33 applies a voltage at Vcc level to data line D and also applies a voltage at GND level to data line /D. Thereby, the potential on bit line BL attains (Vcc−Vthb) level, and the potential on bit line /BL attains the GND level. Since word line WL is supplied with boosted voltage Vpp, a voltage at (Vcc−Vthb) level is applied to storage node SN of memory cell 25. In the above manner, high data at (Vcc−Vthb) level is written into memory cell 25 in the test mode.

When high data is to be written in the normal mode, boosted potential Vpp is applied onto bit line isolating signal lines BLIa and BLIb. When write buffer 33 applies a voltage at Vcc level to data line D, the potential on bit line BL therefore attains Vcc level, and storage node SN of memory cell 25 is supplied with a voltage at Vcc level. Selected word line WL is supplied with boosted voltage Vpp. In this manner, high data at Vcc level is written in the normal mode. Thus, writing of high data in the normal mode is performed in the same manner as the writing in the normal mode at the DRAM of the embodiment 1.

According to the DRAM of the embodiment 2, as described above, a voltage at a level lower than that in the normal mode is applied onto bit line isolating signal lines BLIa and BLIb for writing high data into the memory cell in the test mode. Therefore, the potential on the storage node of the memory cell in the test mode is lower than that in the normal mode. Therefore, a time before an H→L error occurs can be reduced, and the test time can be reduced. Thus, detection of a failure can be performed efficiently.

Figure 15:
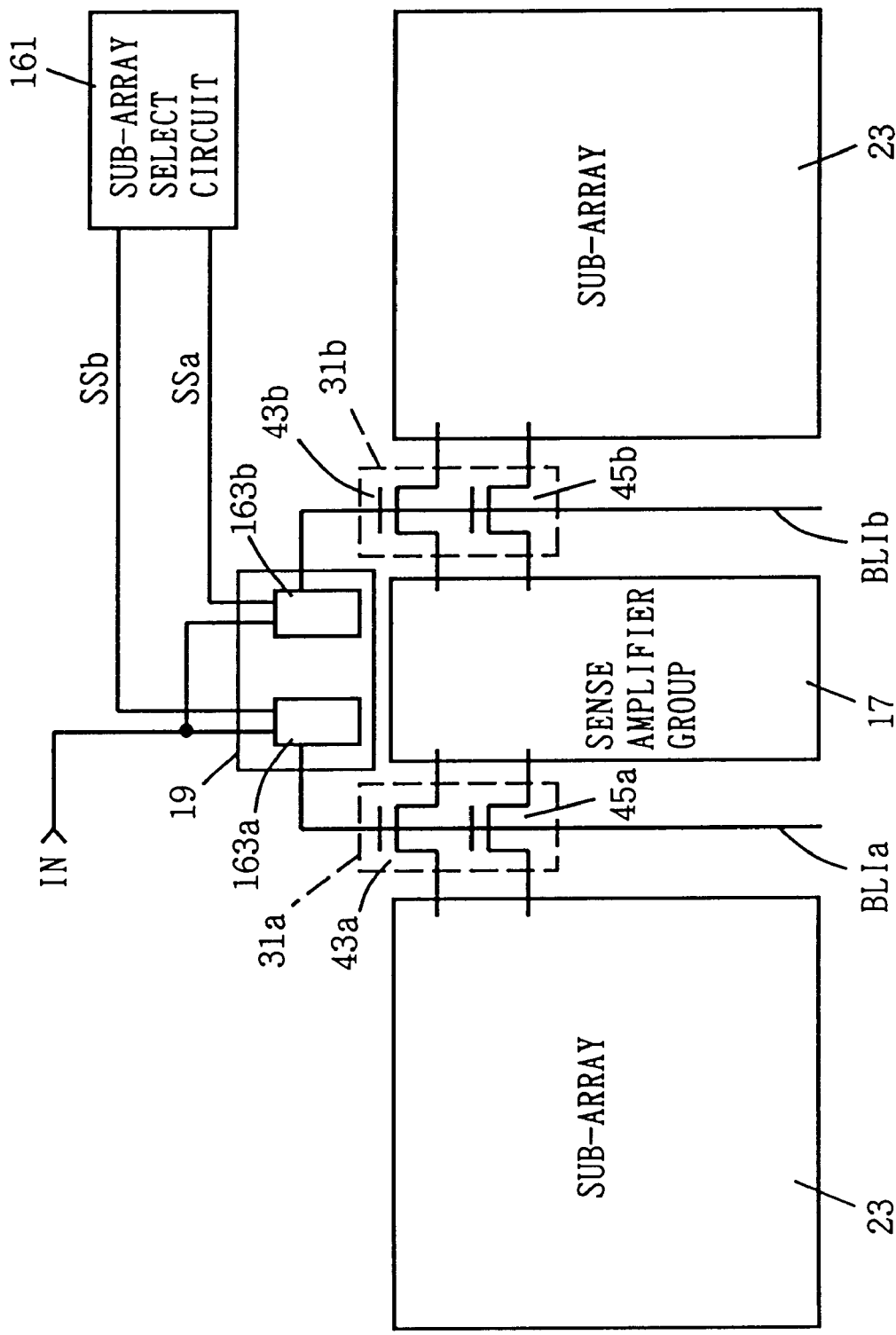
FIG. 15 is a schematic block diagram showing a distinctive feature of the DRAM of the embodiment 2 of the invention.

Referring to FIG. 15, a distinctive feature of the DRAM of the embodiment 2 will be described below. The same portions as those in FIGS. 2 and 4 bear the same reference numbers, and will not be described below. Referring to FIG. 15, when a sub-array select signal SSa issued from a sub-array select circuit 161 is at H-level and a sub-array select signal SSb is at L-level, sub-array 23 connected to connection circuit 45a is selected. Thus, driver 163a included in BLI driver 19 receives sub-array select signal SSb at L-level, and issues a signal at H-level onto bit line isolating signal line BLIa. In this case, driver 163a issues a signal at Vcc level onto bit line isolating signal line BLIa in the test mode, and issues a signal at Vpp level in the normal mode. Driver 163b included in BLI driver 19 receives sub-array select signal SSa at H-level, and issues a signal at L-level (GND level) onto bit line isolating signal line BLIb. Therefore, NMOS transistors 43b and 45b in connection circuit 31b are turned off, and sub-array 23 connected to connection circuit 31b is isolated from sense amplifier group 17.

When the sub-array 23 connected to connection circuit 31b is to be selected, sub-array select circuit 161 applies sub-array select signal SSa at L-level and sub-array select signal SSb at H-level to BLI driver 19. Driver 163a receives sub-array select signal SSb at H-level, and issues a signal at L-level (GND level) onto bit line isolating signal line BLIa. Thereby, sub-array 23 connected to connection circuit 31a is isolated from sense amplifier group 17. Driver 163b receives sub-array select signal SSa at L-level, and issues a signal at H level onto bit line isolating signal line BLIb. Driver 163b issues a signal at Vcc level in the test mode, and issues a signal at Vpp level in the normal mode.

Drivers 163a and 163b receive precharge signal IN for the row decoder, which is issued from the IN generating circuit in FIG. 12. Therefore, precharge signal IN for the row decoder attains H-level when memory cell array 5 (see FIG. 1) is selected and row address strobe signal /RAS attains L-level. Thus, precharge signal IN for the row decoder is at H-level, when writing into sub-array 23 is to be performed.

Figure 16:
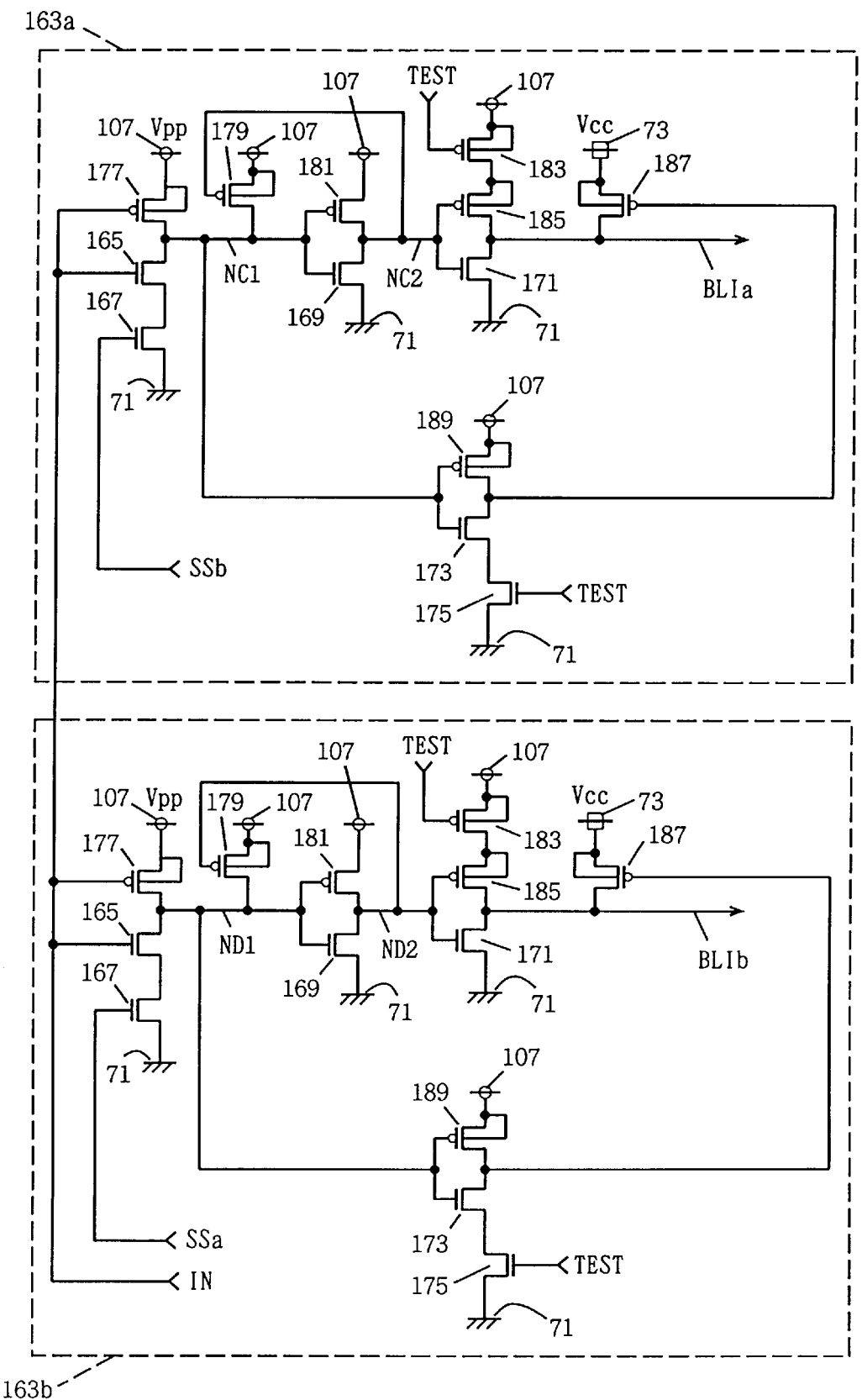
FIG. 16 is a circuit diagram specifically showing a BLI driver 19 in FIG. 10.

Referring to FIG. 16, BLI driver 19 in FIG. 15 will now be described more in detail. The same portions as those in FIG. 15 bear the same reference numbers, and will not be described below. Referring to FIG. 16, driver 163a includes NMOS transistors 165, 167, 169, 171, 173 and 175 as well as PMOS transistors 177, 179, 181, 183, 185, 187 and 189. PMOS transistor 177 and NMOS transistors 165 and 167 are connected in series between a node supplied with boosted voltage Vpp from Vpp power supply 107 and a node supplied with ground voltage GND from ground 71. PMOS transistor 177 and NMOS transistor 165 are supplied on their gates with precharge signal IN for the row decoder. NMOS transistor 167 is supplied on its gate with sub-array select signal SSb.

PMOS transistor 179 is arranged between a node supplied with boosted voltage Vpp from Vpp power supply 107 and a node NC1, and has a gate connected to a node NC2. PMOS transistor 181 and NMOS transistor 169 are connected in series between a node supplied with boosted voltage Vpp from Vpp power supply 107 and a node supplied with ground voltage GND from ground 71. Gates of PMOS transistor 181 and NMOS transistor 169 are connected to node NC1. PMOS transistors 183 and 185 and NMOS transistor 171 are connected in series between a node supplied with boosted voltage Vpp from Vpp power supply 107 and a node supplied with ground voltage GND from ground 71. PMOS transistor 183 is supplied on its gate with first test mode entry signal TEST1. Gates of PMOS transistor 185 and NMOS transistor 171 are connected to a node NC2.

PMOS transistor 187 is arranged between a node supplied with power supply voltage Vcc from Vcc power supply 73 and bit line isolating signal line BLIa, and has a gate connected to a drain of NMOS transistor 173. PMOS transistor 189 and NMOS transistors 173 and 175 are connected in series between a node supplied with boosted voltage Vpp from Vpp power supply 107 and a node supplied with ground voltage GND from ground 71. Gates of PMOS transistor 189 and NMOS transistor 173 are connected to node NC1. NMOS transistor 175 is supplied on its gate with first test mode entry signal TEST1, which is issued from the TEST generating circuit in FIG. 11. Therefore, first test mode entry signal TEST1 is at H-level when the operation is in the test mode. Structures of PMOS transistors 177 to 189 are similar to that of the PMOS transistor in FIG. 9.

Driver 163a has a circuit structure similar to that of driver 163a.

However, sub-array select signal SSa is supplied to the gate of NMOS transistor 167 of driver 163b in contrast to the driver 163a, of which NMOS transistor 167 receives sub-array select signal SSb. Also, driver 163b differs from driver 163a in that gates of PMOS transistors 181 and 189, gates of NMOS transistors 169 and 173, drains of PMOS transistors 179 and 177 and a drain of NMOS transistor 165 are connected to a node ND1. In driver 163b, gates of PMOS transistors 179 and 185, gate of NMOS transistor 171, drain of PMOS transistor 181 and drain of NMOS transistor 169 are connected to node ND2. Drains of PMOS transistors 185 and 187 as well as drain of NMOS transistor 171 are connected to bit line isolating signal line BLIb.

Figure 17:
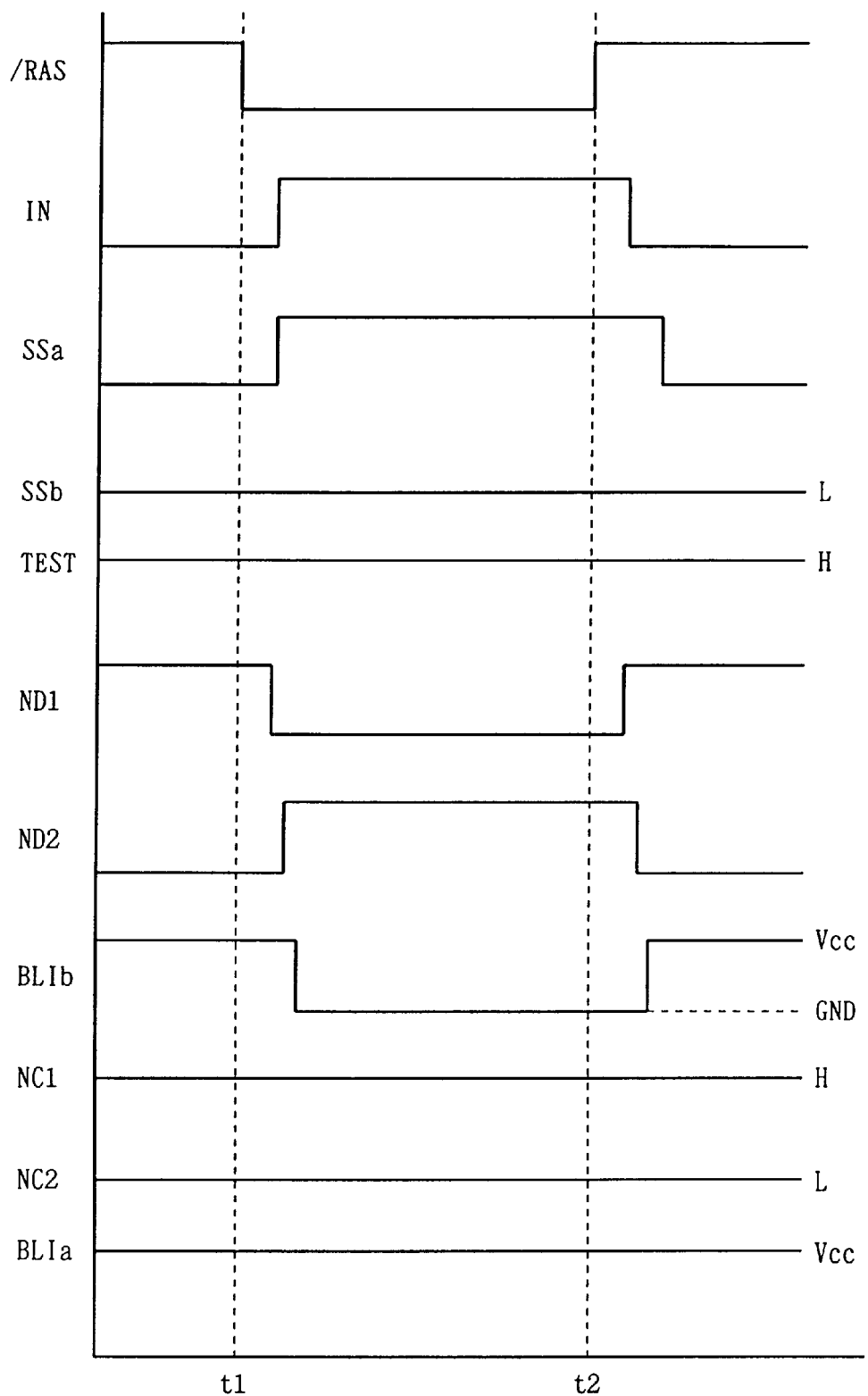
FIG. 17 is a timing chart showing an operation, in a test mode, of the BLI driver shown in FIG. 16.

Referring to FIGS. 16 and 17, an operation of the BLI driver will be described below. It is now assumed that sub-array 23 connected to connection circuit 31a in FIG. 15 is to be selected, and the operation is in the test mode. In this case, first test mode entry signal TEST1 is at H-level. Before time t1, precharge signal IN for the row decoder is at L-level, so that potentials on nodes NC1 and ND1 are at H-level. Therefore, NMOS transistor 173 and PMOS transistor 187 are on, and bit line isolating signal lines BLIa and BLIb are supplied with power supply voltage Vcc from Vcc power supply 73.

After row address strobe signal /RAS attains L-level at time t1, precharge signal IN for the row decoder and sub-array select signal SSa attain H-level, whereby the potentials on nodes ND1 and ND2 attain L- and H-level, respectively. Therefore, PMOS transistor 187 of driver 163b is turned off. Meanwhile, the potential on node ND2 is at H-level, so that bit line isolating signal line BLIb is supplied with ground voltage GND from ground 71. After row address strobe signal /RAS attains L-level at time t1, sub-array select signal SSb is still at L-level even when precharge signal IN for the row decoder attains H-level. Therefore, the potential at H-level is latched on node NC1. Accordingly, the potential on bit line isolating signal line BLIa remains at Vcc level.

When precharge signal IN for the row decoder attains L-level after row address strobe signal /RAS attains H-level at time t2, the potential on node ND1 attains H-level. Therefore, NMOS transistor 173 and PMOS transistor 187 of driver 163b are turned on, and bit line isolating signal line BLIb is supplied with power supply voltage Vcc from Vcc power supply 73.

Figure 18:
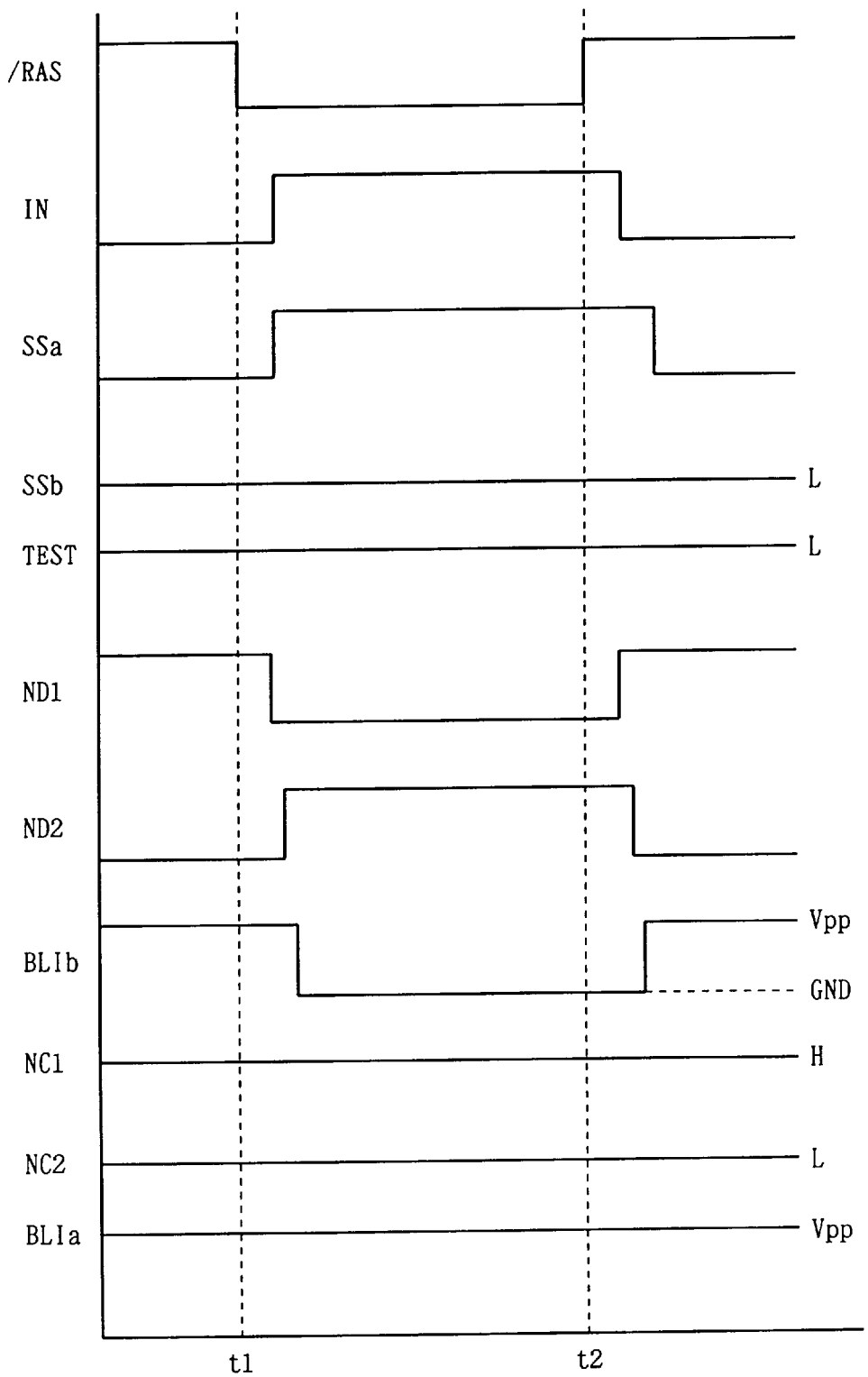
FIG. 18 is a timing chart showing an operation, in a normal mode, of the BLI driver shown in FIG. 16.

Referring to FIG. 18, description will now be given on an operation in the normal mode of the BLI driver shown in FIG. 16, and particularly on the case where sub-array 23 connected to connection circuit 31a in FIG. 15 is to be selected.

Since the operation is in the normal mode, first test mode entry signal TEST1 is at L-level. Before time t1, precharge signal IN for the row decoder is at L-level, the potentials on nodes NC1 and ND1 are at H-level, and the potentials on nodes NC2 and ND2 are at L-level. Therefore, PMOS transistors 183 and 185 are turned on, and boosted voltage Vpp is supplied onto bit line isolating signal lines BLIa and BLIb from Vpp power supply 107. When precharge signal IN for the row decoder and sub-array select signal SSa attain H-level after row address strobe signal /RAS attains L-level at time t1, the potential on node ND1 attains L-level, and the potential on node ND2 attains H-level. Therefore, PMOS transistor 187 of driver 163b is turned off.

Since the potential on node ND2 is at H-level, bit line isolating signal line BLIb is supplied with ground voltage GND from ground 71. After row address strobe signal /RAS attains L-level at time t1, sub-array select signal SSb is still at L-level even when precharge signal IN for the row decoder attains H-level. Therefore, the potential at H-level is latched on node NC1. Therefore, the potential on bit line isolating signal line BLIa remains at Vpp level. When precharge signal IN for the row decoder attains L-level after row address strobe signal /RAS attains H-level at time t2, the potential on node ND1 attains H-level. Therefore, PMOS transistors 183 and 185 of driver 163b are turned on, and boosted voltage Vpp is supplied onto bit line isolating signal line BLIb from Vpp power supply 107.

According to the DRAM of the embodiment 2 as described above, a voltage at a level lower than that in the normal mode is applied onto bit line isolating signal lines BLIa and BLIb for writing high data into the memory cell in the test mode. Therefore, the potential on storage node SN of the memory cell in the test mode is lower than that in the normal mode. Therefore, a time before an H→L error occurs can be reduced, and the test time can be reduced. Thus, detection of a failure can be performed efficiently.

Embodiment 3

A whole structure of a DRAM according to an embodiment 3 of the invention is similar to that of the DRAM in FIG. 1. Referring to FIG. 1, the row decoder and BLI driver 9 and memory cell array 5 in the DRAM of the embodiment 3 are similar to the row decoder and BLI driver 9 and memory cell array 5 in FIG. 2. Referring to FIG. 2, sub-array 23 in the DRAM according of the embodiment 3 is similar to sub-array 23 in FIG. 3. Referring to FIG. 2, row decoder 21 and sub-array 23 in the DRAM of the embodiment 3 are similar to row decoder 21 and sub-array 23 in FIG. 6. Referring to FIGS. 1 and 6, control circuit 15 and decoder 75 in the DRAM of the embodiment 3 are similar to control circuit 15 and decoder 75 in FIG. 7. However, there is a difference in word drivers WD1–WD4. More specifically, in the embodiment 1, word drivers WD1–WD4 issue the voltage at Vcc level in the test mode, and issues the voltage at Vpp level in the normal mode. However, in the embodiment 3, word drivers WD1–WD4 issue boosted voltage Vpp in both the test and normal modes. Further, TEST signal generating circuit 83 is not employed in the embodiment 3.

Referring to FIG. 7, IN signal generating circuit 79 in the DRAM of the embodiment 3 is similar to the IN generating circuit in FIG. 12. Referring to FIG. 2, sense amplifier group 17 and sub-array 23 as well as its peripheral circuit are similar to sense amplifier group 17, sub-array 23 and it peripheral circuit in FIG. 15. However, there is a difference in BLI driver 19. In the embodiment 2, BLI driver 19 applies a voltage at Vcc level onto bit line isolating signal lines BLIa and BLIb in the test mode, and applies a voltage at Vpp level to the same in the normal mode. In the embodiment 3, however, BLI driver 19 applies a voltage at Vpp level onto bit line isolating signal lines BLIa and BLIb in both the test and normal modes.

Figure 19:
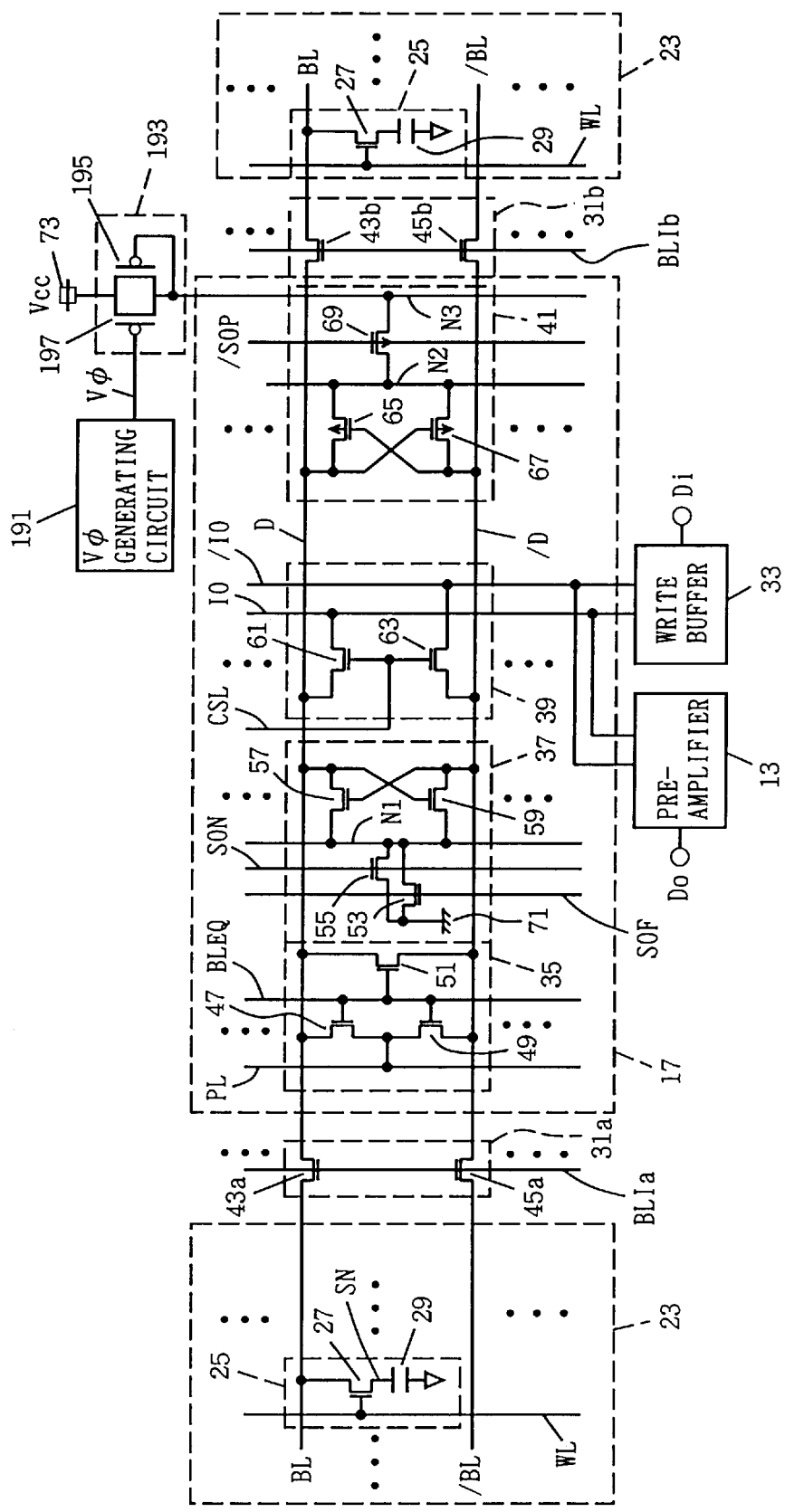
FIG. 19 is a circuit diagram specifically showing a distinctive portion of a DRAM according to an embodiment 3 of the invention.

Referring to FIG. 19, a distinctive feature of the DRAM of the embodiment 3 will be specifically described below. The same portions as those in FIG. 4 bear the same reference numbers, and will not be described below. In FIG. 19, the DRAM includes a Vφ generating circuit 191, a sense amplifier control circuit 193, sub-array 23, connection circuits 31a and 31b, sense amplifier group 17, preamplifier 13 and write buffer 33. Sense amplifier control circuit 193 includes PMOS transistors 195 and 197. PMOS transistors 195 and 197 are connected in series between a node supplied with power supply voltage Vcc from Vcc power supply 73 and a node N3. A gate of PMOS transistor 195 is connected to node N3. Signal Vφ is applied to a gate of PMOS transistor 197.

In the test mode for detecting an H→L error such as a pause refresh failure or a disturb refresh failure according to this embodiment, and particularly for writing high data into the memory cell, the potential on the storage node in the memory cell is set to a level lower than that for writing high data into the memory cell in the normal mode.

In the test mode for detecting an H→L error of this embodiment, a voltage at a level lower than that for writing high data into the memory cell in the normal mode is applied to P-channel sense amplifier 41. The test mode for detecting an H→L error may be a mode for detecting a pause refresh failure already described in the embodiment 1, a disturb refresh failure or the like.

Description will be given on a write operation in the normal mode. In the normal mode, signal Vφ is at L-level. Vcc power supply 73 supplies power supply voltage Vcc to node N3. In the normal mode, therefore, the write operation of the DRAM of the embodiment 3 is the same as that in the normal operation of the DRAM (embodiment 1) in FIG. 4. When high data is to be written into memory cell 25, a voltage at Vcc level is applied to storage node SN of memory cell 25. In the normal mode, high data stored in memory cell 25 is at Vcc level.

In the test mode, Vφ generating circuit 191 applies a signal Vφ at H-level to PMOS transistor 197. Therefore, PMOS transistor 197 is turned off, and the potential on node N3 is at (Vcc−Vthp) level, where Vthp represents a threshold voltage of PMOS transistor 195.

Writing of high data in the test mode will be described below. In the test mode, high data at a level lower than that in the normal mode is written in accordance with the following steps. In FIG. 19, it is assumed that sub-array 23 connected to connection circuit 31a is to be selected, and description will be given particularly on memory cell 25 connected to bit line BL. First, a voltage at Vpp level is supplied from write buffer 33 onto I/O line IO, and a voltage at GND level is applied onto I/O line /IO. The potentials on data line D and bit line BL are set to Vcc level, and a voltage at Vcc level is applied to storage node SN of memory cell 25 from bit line BL. Column select line CSL is supplied with a signal at Vcc level, and bit line isolating signal line BLIa and word line WL are supplied with a signal at Vpp level. As described above, the first process is the same as that in the write operation in the normal mode. Since a drivability of write buffer 33 is higher than that of N-channel sense amplifier 41, the potential on data line D does not attain (Vcc−Vthp) level but attains Vcc level when write buffer 33 applies a voltage at Vpp level onto I/O line IO.

Figure 20:
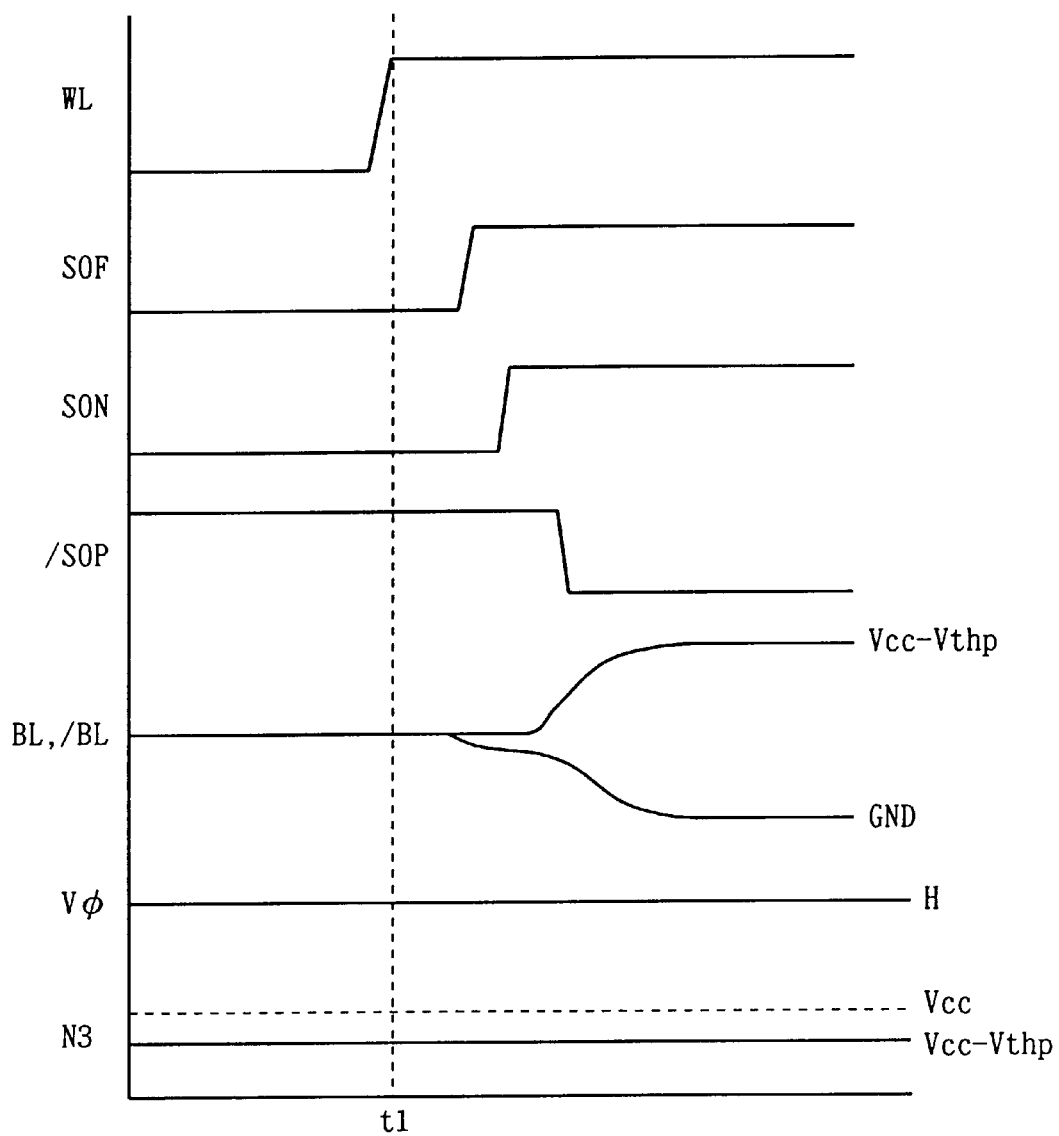
FIG. 20 is a timing chart showing a refresh operation of a DRAM according to the embodiment 3 of the invention.

Second, refreshing is performed. FIG. 20 is a timing chart showing a refresh operation of the DRAM of the embodiment 3. When the potential on word line WL attains H-level at time t1, a potential difference appears on bit line pair BL and /BL. When sense amplifier control signals SOF and SON attain H-level, and sense amplifier control signal /SOP attains L-level, P- and N-channel sense amplifiers 37 and 41 are activated, and the potential difference on bit line pair BL and /BL is amplified. Since a potential at (Vcc−Vthp) level is already applied to node N3, the potential on bit line BL attains (Vcc−Vthp) level. Therefore, high data at (Vcc−Vthp) level (i.e., level lower than that in the normal mode) is written into memory cell 25. Column select line CSL is supplied with a signal at Vcc level, and word line WL and bit line isolating signal line BLIa are supplied with a signal at Vpp level.

Figure 21:
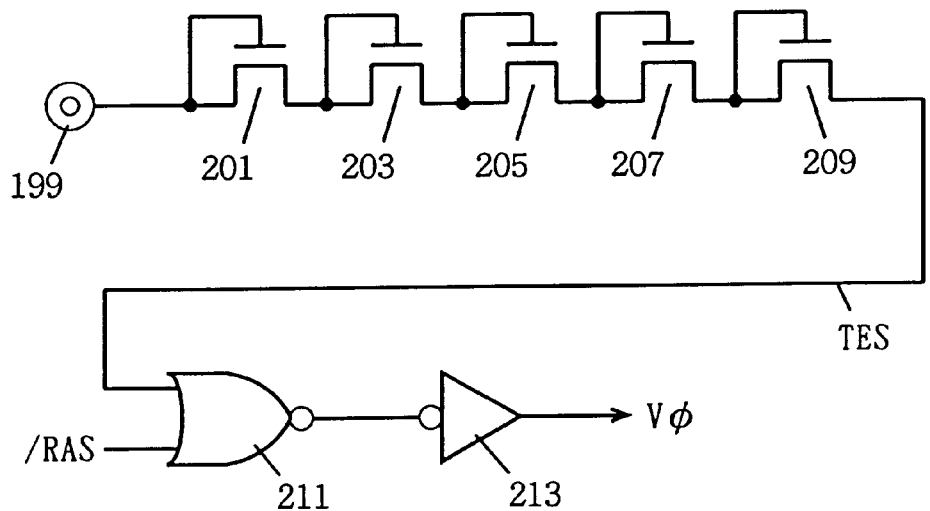
FIG. 21 is a circuit diagram specifically showing a Vφ generating circuit in FIG. 19.
Figure 22:
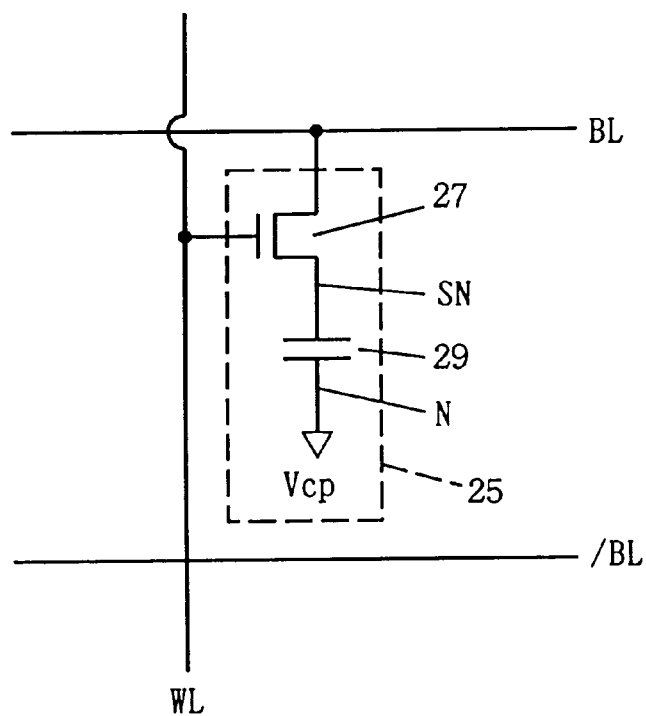
FIG. 22 shows a problem in a conventional DRAM.

Referring to FIG. 21, Vφ generating circuit 191 in FIG. 19 will now be described below in detail. Referring to FIG. 21, Vφ generating circuit 191 includes NMOS transistors 201, 203, 205, 207 and 209, an NOR circuit 211 and an inverter 213. NMOS transistors 201–209 are connected in series between a pin 199 and a node from which second test mode entry signal TEST2 is issued. Each of NMOS transistors 201–209 is diode-connected. NOR circuit 211 is supplied on one of its input nodes with second test mode entry signal TEST2, and is supplied on the other input node with row address strobe signal /RAS. An output node of NOR circuit 21 is connected to an input node of inverter 213. Inverter 213 issues signal Vφ. Pin 199 may be a dedicated pin or an unoccupied pin in a conventional package.

When the test mode is to be started, a voltage at a level higher than Vcc level is applied to pin 199. Thereby, signal Vφ attains H-level. Meanwhile, in the normal mode, the potential on pin 199 is fixed at GND level. Thereby, second test mode entry signal TEST2 attains L-level. When row address strobe signal /RAS is at L-level, signal Vφ attains L-level.

According to the DRAM of the embodiment 3 of the invention, the voltage which is applied to P-channel sense amplifier 41 in the test mode is set to (Vcc−Vthp) level, whereby high data at (Vcc−Vthp) level (high data at a level lower than that in the normal mode) is written into the memory cell. Therefore, a time before an H→L error occurs is reduced, and a test time can be reduced. Thus, detection of a failure can be performed efficiently.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device comprising:
a plurality of memory cells arranged in a matrix form of rows and columns, each memory cell holding data at a high or low level; and write voltage control means for writing a voltage at a first level in a normal mode, and writing a voltage at a second level in a test mode, during an operation of writing data at the high level into each of said memory cells;

wherein said second level voltage is lower than said first level voltage.

2. The dynamic semiconductor memory device according to claim 1, further comprising:
a plurality of word lines arranged correspondingly to said plurality of rows, respectively, and each being connected to said memory cells in the corresponding row; and a plurality of bit lines arranged correspondingly to said plurality of columns, respectively, and each being connected to said memory cells in the corresponding column, wherein each of said memory cells includes a transfer gate controlled by changing a level of a potential on the corresponding word line, said write voltage control means is word line selecting means, said word line selecting means selects said word line in accordance with a row address signal, and controls a level of a voltage applied onto said selected word line such that, in said test mode and particularly for writing the voltage at said second level into said memory cell connected to said selected word line, the voltage at a level lower than that in the case of writing the voltage at said first level is applied into said memory cell from said bit line through said transfer gate, and data corresponding to the voltage applied from said corresponding bit line is written into said memory cell connected to said selected word line.

3. The dynamic semiconductor memory device according to claim 2, wherein
said transfer gate is a transistor;
said transistor includes:
a control electrode connected to said corresponding word line,
a first electrode connected to said corresponding bit line, and
a second electrode connected internally to said memory cell; and
in said test mode and particularly for writing the voltage at said second level into said memory cell connected to said selected word line, said word line selecting means applies onto said word line a voltage smaller in absolute value than that in the case of writing the voltage at said first level.

4. The dynamic semiconductor memory device according to claim 1, further comprising:
a plurality of bit lines arranged correspondingly to said plurality of columns, respectively, and each being connected to said memory cells in the corresponding column,
a plurality of data lines arranged correspondingly to said plurality of bit lines, and being set to potentials corresponding to externally applied data, respectively, and
a plurality of connecting means arranged correspondingly to said plurality of bit lines for connecting said corresponding bit lines to said corresponding data lines, respectively, wherein
said write voltage control means is bit line isolating means, in said test mode and particularly for writing the voltage at said second level into said memory cell, said bit line isolating means controls said connecting means such that a voltage at a level lower than that in the case of writing the voltage at said first level is transmitted onto said bit line from said data line, and data corresponding to a voltage applied from said corresponding bit line is written into said memory cell.

5. The dynamic semiconductor memory device according to claim 4, wherein said connecting means is a transistor, and in said test mode and particularly for writing the voltage at said second level into said memory cell, said bit line isolating means applies to a control electrode of said transistor a voltage smaller in absolute value than that in the case of writing the voltage at said first level.

6. The dynamic semiconductor memory device according to claim 1, further comprising:

a plurality of bit line pairs arranged correspondingly to said plurality of columns, respectively, and each being connected to said memory cells in the corresponding column, and a plurality of sense amplifiers arranged correspondingly to said plurality of bit line pairs for sensing and amplifying potential differences on said corresponding bit line pairs, respectively, wherein said write voltage control means is sense amplifier control means, in said test mode and particularly for writing the voltage at said second level into said memory cell, said sense amplifier control means sets an amplification factor of said sense amplifier to be smaller than that in the case of writing the voltage at said first level, and data corresponding to a voltage applied from the corresponding bit line of said corresponding bit line pair is written into said memory cell.

7. The dynamic semiconductor memory device according to claim 1, wherein said test mode being performed for detecting a failure that the data at said high level written into said memory cell changes into the data at said low level.

8. A method of testing a dynamic semiconductor memory device having a plurality of memory cells holding data at a high or low level, comprising the steps of:

writing data at said high level into each memory cell using a prescribed voltage level that is lower than a first voltage level used for writing data at said high level in a normal mode;

reading data held in each memory cell after writing data at said high level into each of said memory cells; and determining whether the data written at said high level has changed into the low level data based on said step of reading.

* * * * *